US011101544B2

(12) United States Patent
Pearson et al.

(10) Patent No.: US 11,101,544 B2
(45) Date of Patent: Aug. 24, 2021

(54) CONTROL MODULE FOR A LIGHTING FIXTURE

(71) Applicant: Lutron Technology Company LLC, Coopersburg, PA (US)

(72) Inventors: Sean R. Pearson, Allentown, PA (US); Nicholas R. Baer, Coral Springs, FL (US); Angelo Caruso, Boynton Beach, FL (US); Thomas E. Hibshman, Allentown, PA (US); Kevin L. Gascho, Bethlehem, PA (US); Robert Bollinger, Jr., Fogelsville, PA (US); Richard S. Camden, Coopersburg, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 16/933,310

(22) Filed: Jul. 20, 2020

(65) Prior Publication Data

US 2021/0007198 A1    Jan. 7, 2021

Related U.S. Application Data

(63) Continuation of application No. 16/551,315, filed on Aug. 26, 2019, now Pat. No. 10,721,805, which is a (Continued)

(51) Int. Cl.
*H01Q 1/24* (2006.01)
*H05K 1/18* (2006.01)
(Continued)

(52) U.S. Cl.
CPC ............... *H01Q 1/24* (2013.01); *H01Q 1/38* (2013.01); *H01Q 1/44* (2013.01); *H01Q 1/52* (2013.01);
(Continued)

(58) Field of Classification Search
None
See application file for complete search history.

(56) References Cited

U.S. PATENT DOCUMENTS 8,009,042 B2    8/2011  Steiner et al.
8,199,010 B2    6/2012  Sloan et al.
(Continued)

OTHER PUBLICATIONS

Lutron Electronics Co., Inc., Wired Daylight Sensor with Infrared Receiver, Wired Sensors Lutron Specification Submittal, EC-DIR-WH, Mar. 24, 2016, pp. 1-3.

*Primary Examiner* — Jany Richardson
(74) *Attorney, Agent, or Firm* — Michael Czarnecki; Glen Farbanish; Philip Smith

(57) ABSTRACT

A control module attached to a lighting fixture and having a front cover portion may comprise one or more sensors, such as a daylight and/or occupancy sensor, for sensing information through the front cover portion. The control module may have a main printed circuit board (PCB) that extends from a front side to a rear side of the control module, and a sensor PCB perpendicular to the main PCB to enable at least one sensor attached to the sensor PCB to face the front side of the control module. The main PCB may comprise a wireless communication circuit and an antenna for communicating radio frequency (RF) signals, wherein at least a portion of the antenna is located within a plastic lip of the front cover portion of the control module. The control module may further have a conductive enclosure to reduce radio-frequency interference noise from coupling into the antenna.

20 Claims, 14 Drawing Sheets

Related U.S. Application Data continuation of application No. 15/970,000, filed on May 3, 2018, now Pat. No. 10,398,007.

(60) Provisional application No. 62/502,357, filed on May 5, 2017.

(51) Int. Cl.
| | |
|---|---|
| *H05K 1/14* | (2006.01) |
| *H05K 9/00* | (2006.01) |
| *H05K 5/02* | (2006.01) |
| *H01Q 7/00* | (2006.01) |
| *H01Q 1/38* | (2006.01) |
| *H01Q 1/44* | (2006.01) |
| *H01Q 1/52* | (2006.01) |
| *H01Q 9/42* | (2006.01) |
| *H05B 47/19* | (2020.01) |
| *H05B 47/11* | (2020.01) |
| *H05B 47/115* | (2020.01) |
| *H05B 47/18* | (2020.01) |
| *H05B 45/10* | (2020.01) |

(52) U.S. Cl.
CPC ............... *H01Q 7/00* (2013.01); *H01Q 9/42* (2013.01); *H05B 47/11* (2020.01); *H05B 47/115* (2020.01); *H05B 47/18* (2020.01); *H05B 47/19* (2020.01); *H05K 1/141* (2013.01); *H05K 1/181* (2013.01); *H05K 5/0217* (2013.01); *H05K 9/0049* (2013.01); *H05B 45/10* (2020.01); *H05K 2201/044* (2013.01); *H05K 2201/10098* (2013.01); *H05K 2201/10121* (2013.01); *H05K 2201/10151* (2013.01)

(56) References Cited

U.S. PATENT DOCUMENTS

| | | |
|---|---|---|
| 8,228,184 B2 | 7/2012 | Blakeley et al. |
| 8,410,706 B2 | 4/2013 | Steiner et al. |
| 8,451,116 B2 | 5/2013 | Steiner et al. |
| 8,598,978 B2 | 12/2013 | Knode |
| 9,155,172 B2 | 10/2015 | Baragona et al. |
| 9,361,790 B2 | 6/2016 | Altonen et al. |
| 9,413,171 B2 | 8/2016 | Neyhart |
| 10,398,007 B2 | 8/2019 | Pearson et al. |
| 10,721,805 B2 | 7/2020 | Pearson et al. |
| 2011/0139965 A1 | 6/2011 | Sloan et al. |
| 2013/0030589 A1 | 1/2013 | Pessina et al. |
| 2014/0132475 A1 | 5/2014 | Bhutani et al. |
| 2015/0349402 A1 | 12/2015 | Camden et al. |
| 2017/0280533 A1 | 9/2017 | Dimberg et al. |
| 2018/0077779 A1* | 3/2018 | Johnson ............... H01Q 1/2291 |
| 2019/0174608 A1* | 6/2019 | Verfuerth ............... H05B 41/36 |
| 2019/0215935 A1* | 7/2019 | Trublowski .......... H01Q 1/2283 |

* cited by examiner

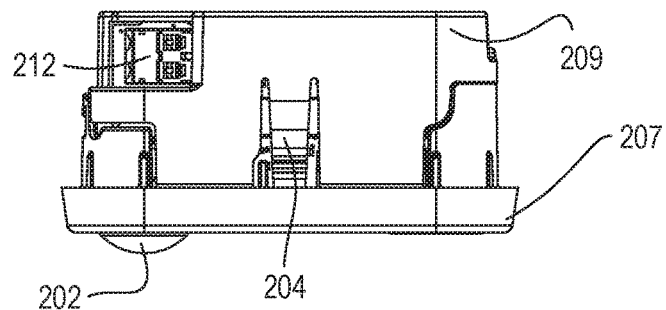
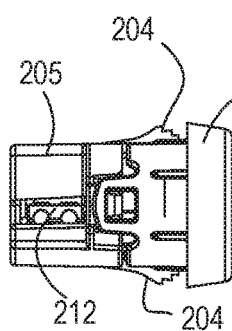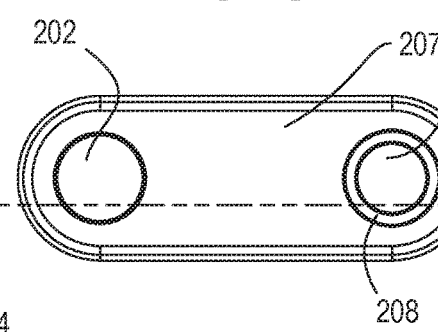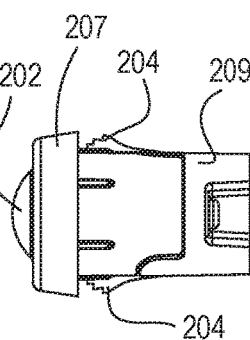
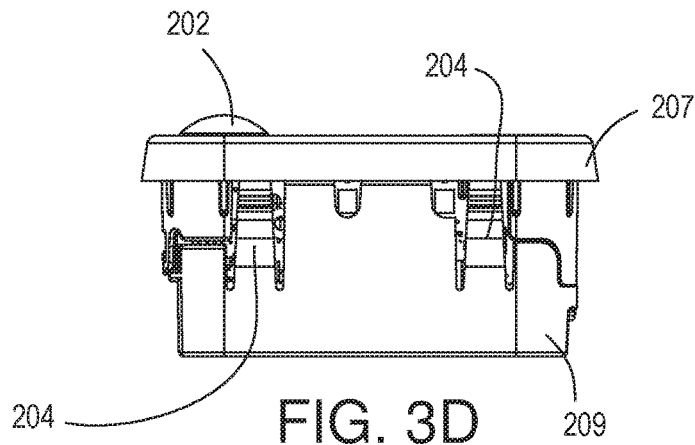
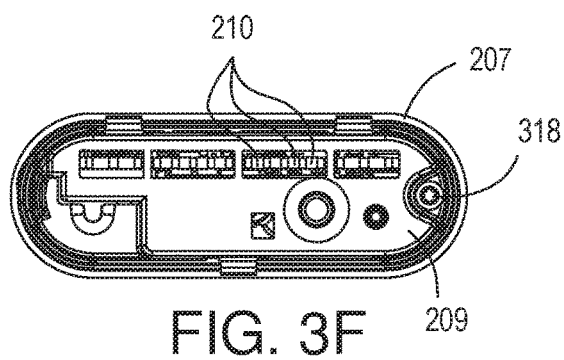

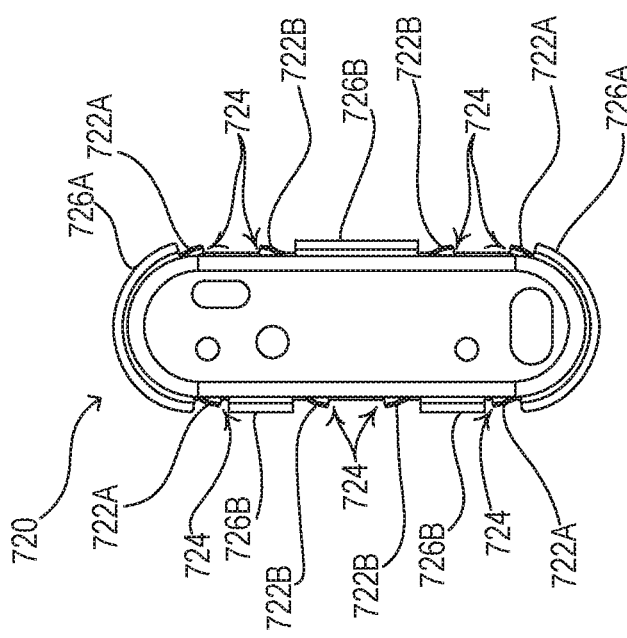
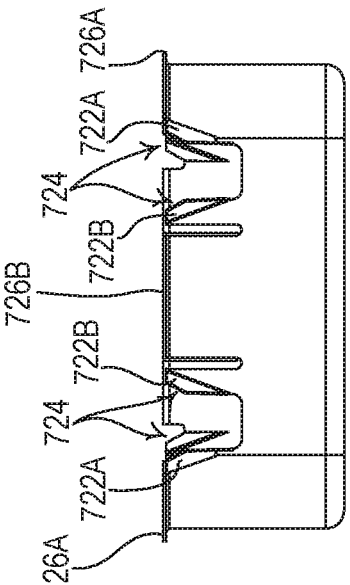
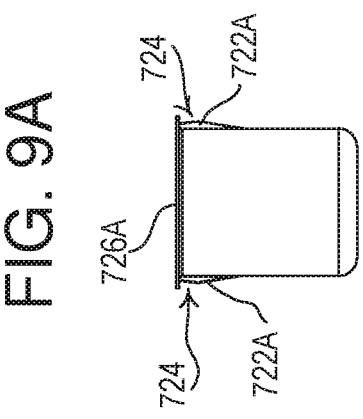
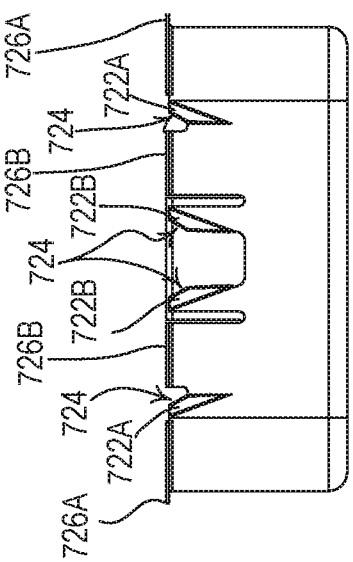
FIG. 9A
FIG. 9B
FIG. 9C
FIG. 9D

CONTROL MODULE FOR A LIGHTING FIXTURE

CROSS-REFERENCE TO RELATED APPLICATIONS

This application is a continuation of U.S. patent application Ser. No. 16/551,315, filed Aug. 26, 2019, now U.S. Pat. No. 10,721,805, issued Jul. 21, 2020, which is a continuation of U.S. patent application Ser. No. 15/970,000, filed on May 3, 2018, now U.S. Pat. No. 10,398,007, issued Aug. 27, 2019, which claims priority to Provisional U.S. Patent Application No. 62/502,357, filed May 5, 2017, the entire disclosures of which are incorporated by reference herein.

BACKGROUND

A user environment, such as a residence or an office building for example, may be configured using various types of load control systems. A lighting control system may be used to control the lighting loads in the user environment. A motorized window treatment control system may be used to control the natural light provided to the user environment. A heating, ventilation, and air-conditioning (HVAC) system may be used to control the temperature in the user environment.

Each load control system may include various control devices, including input devices and load control devices. The load control devices may receive digital messages, which may include load control instructions, for controlling an electrical load from one or more of the input devices. The load control devices may receive the digital messages via radio frequency (RF) signals. Each of the load control devices may be capable of directly controlling an electrical load. The input devices may be capable of indirectly controlling the electrical load via digital messages transmitted to the load control device.

The load control system may have various types of load control devices installed therein, such as lighting control devices (e.g., dimmer switches, electronic switches, ballasts, or light-emitting diode (LED) drivers), motorized window treatments, temperature control devices (e.g., a thermostat), AC plug-in load control devices, and/or the like. The load control system may also have various input devices installed therein, such as remote control devices, occupancy sensors, daylight sensors, temperature sensors, and/or the like. The greater the number of load control devices and input devices in a load control environment, the less aesthetically pleasing the load control environment may be to a user.

Implementing each of these load control devices and input devices separately in a load control environment can cause a large number of devices to be installed and configured in the load control system. As these load control devices and input devices generally communicate via RF signals, the implementation of multiple input devices for controlling a number of load control devices can cause increased network traffic, which increases the chances of network inefficiencies. Additionally, the communication of sensed information via RF signals may cause a delay in the time it takes to control an electrical load in response to the sensed information.

SUMMARY

As described herein, a control module may be attached to a lighting fixture. The control module may comprise one or more sensors. The one or more sensors may include a daylight sensing circuit and/or an occupancy sensing circuit. The one or more sensors may sense information through a front cover portion of the control module. For example, the front cover portion may include a light pipe configured to receive daylight for the daylight sensing circuit and/or a lens configured to receive infrared energy for the occupancy sensing circuit.

The control module may have a main printed circuit board (PCB) that extends from a front side of the control module to a rear side of the control module. The main PCB may comprise a wireless communication circuit and a loop antenna for communicating radio frequency (RF) communication signals via the wireless communication circuit. The loop antenna may be located on the main PCB such that at least a portion of transmit/receive portions of the loop antenna are located within a plastic lip of the front cover portion of the control module when the control module is attached to a metal lighting fixture.

The control module may include a sensor PCB that is attached perpendicular to the main PCB to enable at least one sensor attached to the sensor PCB to face the front side of the control module. The sensor PCB may be attached to the main PCB with a solder joint. The solder joint may be located a predefined distance from a surface mount plug/socket pair that supports an electrical connection between the main PCB and the sensor PCB. The lens on the front cover portion of the control module may cover the occupancy sensing circuit installed thereon. The light pipe on the front cover portion may receive light for the daylight sensing circuit and may provide feedback from a feedback light emitting diode (LED).

The main PCB may comprise a communication link connector configured to receive a connection to a communication bus for communicating lighting control instructions to the lighting control device. The main PCB may comprise a control circuit configured to generate lighting control instructions in response to sensed information from the at least one sensor and send the lighting control instruction to the lighting control device via the communication bus.

The control module may comprise a rear cover portion. The main PCB may comprise programming contacts that extend through the rear cover portion for programming the control module. The front cover portion may comprise a configuration button configured to cause the control module to enter an association mode or a discovery mode for programming the control module after the control module is installed in the lighting fixture.

The control module may further be configured to insert into a conductive enclosure. The conductive enclosure may have one or more springs configured to attach the control module to the metal lighting fixture. The springs may be bent away from the conductive enclosure and may further comprise a reverse angle edge cut. The reverse angle edge cut may draw the conductive enclosure and control module closer to the metal lighting fixture. The reverse angle edge cut may further dig into the metal lighting fixture and may provide conductive contact between the conductive enclosure and the metal lighting fixture. The conductive enclosure may further comprise one or more conductive flanges configured to abut the metal lighting fixture to reduce an amount of radio-frequency interference.

BRIEF DESCRIPTION OF THE DRAWINGS

FIGS. 3A-3F are orthographic views depicting different sides of the example control module shown in FIGS. 2A and 2B.

FIGS. 9A-9D are orthographic views depicting different sides of the conductive enclosure shown in FIGS. 7A and 7B.

DETAILED DESCRIPTION

Figure 1:
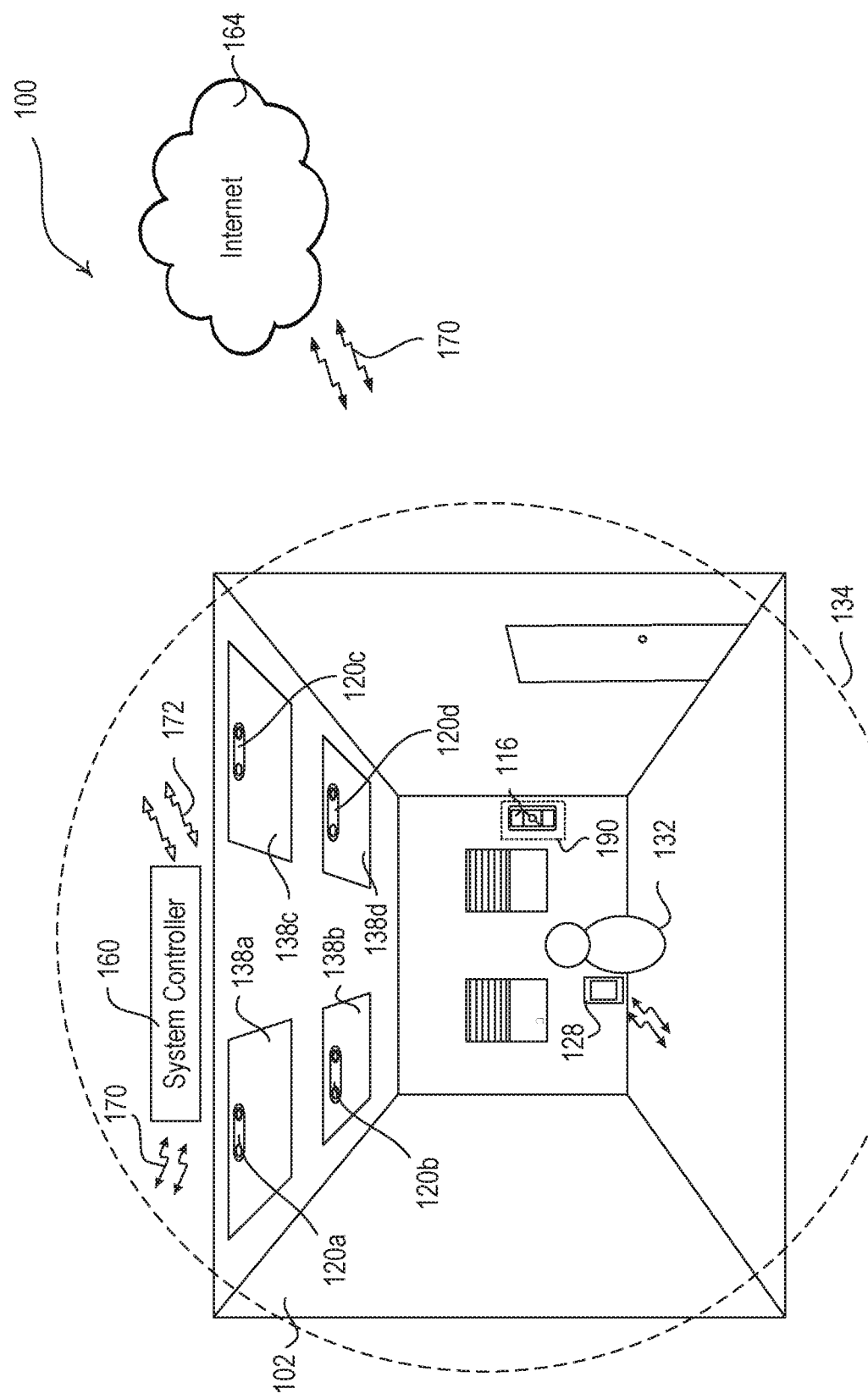
FIG. 1 is a diagram depicting an example load control system that includes lighting control devices.

FIG. 1 depicts an example of a representative load control system 100. As shown in FIG. 1, a room 102 in a building may be installed with one or more lighting fixtures 138a, 138b, 138c, 138d. Each lighting fixture 138a, 138b, 138c, 138d may include a lighting load (e.g., an LED light source) and a respective lighting control device (e.g., an LED driver, ballast, dimming or switching module, or any combination of such devices) for controlling the respective lighting load of the lighting fixture 138a, 138b, 138c, 138d. The lighting control devices may be control-target devices capable of controlling a respective lighting load in response to control instructions received in digital messages.

The room 102 may include one or more control-source devices that may be used to control the lighting fixtures 138a, 138b, 138c, 138d. Control-source devices may be input devices capable of communicating digital messages to control-target devices. The control-source devices may send digital messages for controlling (e.g., indirectly controlling) the amount of power provided to a lighting load by transmitting digital messages to the lighting control device. The digital messages may include control instructions (e.g., load control instructions) or another indication that causes the lighting control device to determine load control instructions for controlling a lighting load.

The control-source devices may include a wired or wireless device. An example control-source device may include a remote control device 116. The remote control device 116 may communicate with control-target devices, such as the lighting control devices in the lighting fixtures 138a, 138b, 138c, 138d, via a wired and/or a wireless communication link. For example, the remote control device 116 may communicate via radio frequency (RF) signals 172. The RF signals 172 may be transmitted via any known RF communication technology and/or protocol (e.g., near field communication (NFC); BLUETOOTH®; WI-FI®; ZIGBEE®, a proprietary communication channel, such as CLEAR CONNECT™, etc.). The remote control device 116 may be attached to the wall or detached from the wall. Examples of remote control devices are described in greater detail in U.S. Pat. No. 8,598,978, issued Dec. 3, 2013, entitled METHOD OF CONFIGURING A TWO-WAY WIRELESS LOAD CONTROL SYSTEM HAVING ONE-WAY WIRELESS REMOTE CONTROL DEVICES; and U.S. Pat. No. 9,361,790, issued Jun. 7, 2016, entitled REMOTE CONTROL FOR A WIRELESS LOAD CONTROL SYSTEM, the entire disclosures of which are hereby incorporated by reference.

The load control system 100 may include control modules, such as control modules 120a, 120b, 120c, 120d. The control modules 120a, 120b, 120c, 120d may each be attached to a respective lighting fixture 138a, 138b, 138c, 138d. The control modules 120a, 120b, 120c, 120d may each be electrically connected to a respective lighting control device within the lighting fixtures 138a, 138b, 138c, 138d for controlling lighting loads. The control modules 120a, 120b, 120c, 120d may include one or more sensors (e.g., sensing circuits) for controlling the lighting loads within the respective lighting fixtures 138a, 138b, 138c, 138d. For example, the control modules 120a, 120b, 120c, 120d may include an occupancy sensor (e.g., an occupancy sensing circuit) and/or a daylight sensor (e.g., a daylight sensing circuit). The control modules 120a, 120b, 120c, 120d may be control-source devices that transmit digital messages to respective lighting control devices to which they are connected (e.g., on a wired communication link). The control modules 120a, 120b, 120c, 120d may also, or alternatively, be control-target devices for receiving digital messages from other devices in the system, such as the remote control device 116 or another control-source device, (e.g., on a wireless communication link via the RF signals 172) for controlling the respective lighting control devices to which they are connected.

The occupancy sensors in the control modules 120a, 120b, 120c, 120d may be configured to detect occupancy and/or vacancy conditions in the room 102 in which the load control system 100 is installed. The control modules 120a, 120b, 120c, 120d may control the lighting control devices in the respective lighting fixtures 138a, 138b, 138c, 138d in response to the occupancy sensors detecting the occupancy or vacancy conditions. The occupancy sensor may operate as a vacancy sensor, such that digital messages are transmitted in response to detecting a vacancy condition (e.g., digital messages may not be transmitted in response to detecting an occupancy condition). Examples of load control systems having occupancy and/or vacancy sensors are described in greater detail in U.S. Pat. No. 8,009,042, issued Aug. 10, 2011, entitled RADIO-FREQUENCY LIGHTING CONTROL SYSTEM WITH OCCUPANCY SENSING; U.S. Pat. No. 8,199,010, issued Jun. 12, 2012, entitled METHOD AND APPARATUS FOR CONFIGURING A WIRELESS SENSOR; and U.S. Pat. No. 8,228,184, issued Jul. 24, 2012, entitled BATTERY-POWERED OCCUPANCY SENSOR, the entire disclosures of which are hereby incorporated by reference.

The daylight sensors in the control modules 120a, 120b, 120c, 120d may be configured to measure a total light intensity in the visible area of the room 102 in which the load control system 100 is installed. The control modules 120a, 120b, 120c, 120d may control the lighting control devices in the respective lighting fixture 138a, 138b, 138c, 138d in response to the light intensity measured by the respective daylight sensor. Examples of load control systems having daylight sensors are described in greater detail in U.S. Pat. No. 8,410,706, issued Apr. 2, 2013, entitled METHOD OF CALIBRATING A DAYLIGHT SENSOR; and U.S. Pat. No. 8,451,116, issued May 28, 2013, entitled WIRELESS BATTERY-POWERED DAYLIGHT SENSOR, the entire disclosures of which are hereby incorporated by reference.

The load control environment 100 may include a system controller 160 operable to transmit and/or receive digital messages via wired and/or wireless communications. For example, the system controller 160 may be configured to transmit and/or receive the RF communication signals 172, to communicate with one or more control devices (e.g., control-source devices and/or control-target devices, such as the control modules 120a, 120b, 120c, 120d). The system controller 160 may communicate digital messages between associated control devices. The system controller 160 may be coupled to one or more wired control devices (e.g., control-source devices and/or control-target devices) via a wired digital communication link.

The system controller 160 may also, or alternatively, communicate via RF communication signals 170 (e.g., NFC; BLUETOOTH®; WI-FI®; cellular; a proprietary communication channel, such as CLEAR CONNECT™, etc.). The system controller 160 may communicate over the Internet 164, or other network, using RF communication signals 170. The RF communication signals 170 may be transmitted using a different protocol and/or wireless band than the RF communication signals 172. For example, the RF communication signals 170 may be transmitted using WI-FI® or cellular signals and the RF communication signals 172 may be transmitted using another RF communication protocol, such as BLUETOOTH®, ZIGBEE®, or a proprietary communication protocol. The RF communication signals 170 may be transmitted using the same protocol and/or wireless band as the RF communication signals 172. For example, the RF communication signals 170 and the RF communication signals 172 may be transmitted using WI-FI® or a proprietary communication protocol.

The system controller 160 may be configured to transmit and receive digital messages between control devices. For example, the system controller 160 may transmit digital messages to the lighting control devices in the lighting fixtures 138a, 138b, 138c, 138d in response to the digital messages received from the remote control device 116. The system controller 160 may transmit digital messages to the control modules 120a, 120b, 120c, 120d (e.g., in response to the digital messages received from the remote control device 116). The digital messages may include association information for being stored at the control devices and/or control instructions for controlling a lighting load.

The load control system 100 may be commissioned to enable control of the lighting loads in the lighting fixtures 138a, 138b, 138c, 138d based on commands communicated from the control devices (e.g., the remote control device 116, the control module 120a, 120b, 120c, 120d, etc.) configured to control the lighting loads. For example, the remote control device 116 may be associated with the lighting control devices within the lighting fixtures 138a, 138b, 138c, 138d and/or the control modules 120a, 120b, 120c, 120d. Association information may be stored on the associated devices, which may be used to communicate and identify digital commands at associated devices for controlling electrical devices in the system 100. The association information may include the unique identifier of one or more of the associated devices. The association information may be stored at the control devices, or at other devices that may be implemented to enable communication and/or identification of digital commands between the control devices.

A network device 128 may be in communication with the system controller 160 for commissioning the load control system 100. The network device may include a wireless phone, a tablet, a laptop, a personal digital assistant (PDA), a wearable device (e.g., a watch, glasses, etc.), or another computing device. The network device 128 may be operated by a user 132. The network device 128 may communicate wirelessly by sending digital messages on RF communication signals 170 (e.g., WI-FI® signals, WI-MAX® signals, cellular signals, etc.). The network device 128 may communicate digital messages in response to a user actuation of one or more buttons on the network device 128. The network device 128 may communicate with the system controller 160 using digital messages transmitted via RF communication signals 170 (e.g., WI-FI® signals, WI-MAX® signals, cellular signals, etc.). Examples of load control systems having WI-FI®-enabled devices, such as smart phones and tablet devices, are described in greater detail in U.S. Patent Application Publication No. 2013/0030589, published Jan. 11, 2013, entitled LOAD CONTROL DEVICE HAVING INTERNET CONNECTIVITY; and U.S. Pat. No. 9,413,171, issued Aug. 9, 2016, entitled NETWORK ACCESS COORDINATION OF LOAD CONTROL DEVICES, the entire disclosures of which are incorporated herein by reference.

The load control system 100 may be commissioned for enabling control of the lighting loads in the load control system 100. The commissioning of the load control system 100 may include associating control devices, which may include control-source devices and/or control-target devices. A load control discovery device 190 may perform discovery and/or association of control devices with the system controller 160. Once control devices are associated, control-source devices may send digital messages to control-target devices to perform control of the lighting loads in the load control system 100. For example, the associated remote control device 116 may send digital messages to the control modules 120a, 120b, 120c, 120d to instruct the respective lighting control devices of the lighting fixtures 138a, 138b, 138c, 138d to increase or decrease the lighting level of the respective lighting loads.

The location of control devices may be discovered relative to the location of other control devices in the load control environment 100. As shown in FIG. 1, control devices (e.g., control-source devices and/or control-target devices) may send a message within a discovery range 134 that may be received by other control devices within the discovery range 134. The message may be a dedicated discovery message that may be identified by a receiving device as a discovery message or another message that may be transmitted in the load control environment 100 and may be interpreted as a discovery message. For example, the message may be an association message for associating devices in the load control environment 100, and/or the message may be a control message for controlling devices in the load control environment 100.

A control device that sends a discovery message (e.g., dedicated discovery message or a message otherwise interpreted as a discovery message) may be identified as a load control discovery device 190. FIG. 1 shows an example in which a control-source device (e.g., remote control device 116) is assigned as the load control discovery device 190 that may send a discovery message within discovery range 134, though other control devices may be assigned as the load control discovery device 190. The discovery range 134 may correspond to a transmission power (e.g., an adjustable transmission power) of the load control discovery device 190. The discovery message sent by the load control discovery device 190 may be received by other devices, such as other control devices and/or the system controller 160.

The control devices (e.g., the control modules 120a, 120b, 120c, 120d) may receive the discovery message and determine whether the discovery message is received at a signal strength that is above a reception power threshold (e.g., a predefined signal strength). The control devices that receive the discovery message may report the receipt of the discovery message. The control devices that receive the discovery message may report the received signal strength of the discovery message to the system controller 160. The control devices that received the discovery message may be provided to the network device 128. The network device 128 may display the discovered control devices to the user 132 for association with a location and/or other control devices.

The control devices (e.g., the control modules 120a, 120b, 120c, 120d) within the discovery range 134 may respond to a discovery message transmitted from the load control discovery device 190. Each control device may calculate the RSSIs of each respective discovery message received. The system controller 160 and/or the network device 128 may organize the control devices according to the received signal strength indicators (RSSIs) of each respective discovery message received.

The transmission of the discovery message may be triggered by actuation of a button on the load control discovery device 190 and/or receipt of a discovery trigger message. For example, the load control discovery device 190 may be identified as remote control device 116 or one of the control modules 120a, 120b, 120c, 120d. The user 132 may actuate a button (e.g., for a predefined period of time) or a sequence of buttons to transmit the discovery message.

The transmission of the discovery message may be performed by sensors in the load control system 100. For example, the load control discovery device may be an occupancy sensor on one of the control modules 120a, 120b, 120c, 120d that may transmit digital messages upon identification of an occupancy condition (e.g., occupied room) and/or a vacancy condition (e.g., unoccupied room). The occupancy condition and/or the vacancy condition may be interpreted by other devices as a discovery message (e.g., when the devices are in a discovery mode). A user may enter or leave a room to trigger transmission of a discovery message in a location of the occupancy sensor to discover devices in that location.

The control devices may transmit a digital message to the system controller 160 to acknowledge receipt of the discovery message. The digital messages may include the device identifier of the load control discovery device 190 and/or a signal strength at which the discovery message was received. The digital messages may be sent to the system controller 160 in response to a request from the system controller 160 (e.g., after the system controller 160 receives the discovery message itself). The request from the system controller 160 may include a request to acknowledge receipt of a message from a device having the device identifier of the load control discovery device 190 and/or the received signal strength of the message.

The system controller 160 may provide the discovered devices to the network device 128 for display to the user 132. The system controller 160 may organize the discovered devices for display to the user 132 for performing association. The system controller 160 may organize the discovered control devices in an organized dataset (e.g., ascending or descending list) that is organized by the signal strength at which the discovery message was received at each device. The system controller 160 may remove any devices from the dataset that receive the discovery message at a signal strength below a predefined threshold (e.g., the reception power threshold). The system controller 160 may include a predefined number of devices in the dataset that have the greatest signal strength. The system controller 160 may send the organized dataset to the network device 128 for displaying to the user 132.

The user 132 may select control devices (e.g., lighting control devices in the lighting fixtures 138a, 138b, 138c, 138d) from the discovered devices displayed on the network device 128. The selected control devices may be associated with the load control discovery device 190 that was used to discover the control devices with the discovery range 134. The network device 128 may generate association information regarding the load control discovery device 190 and the selected control devices in response to the inputs received from the user 132. The selected control devices may also be associated with a control device (e.g., a control-source device) other than the load control discovery device 190.

The network device 128 may transmit the association information to the system controller 160 (e.g., upon actuation of a button by the user 132). The system controller 160 may store the updated association information thereon. The system controller 160 may transmit the association information to the control devices to update the association information stored at the control devices.

Figure 2A:
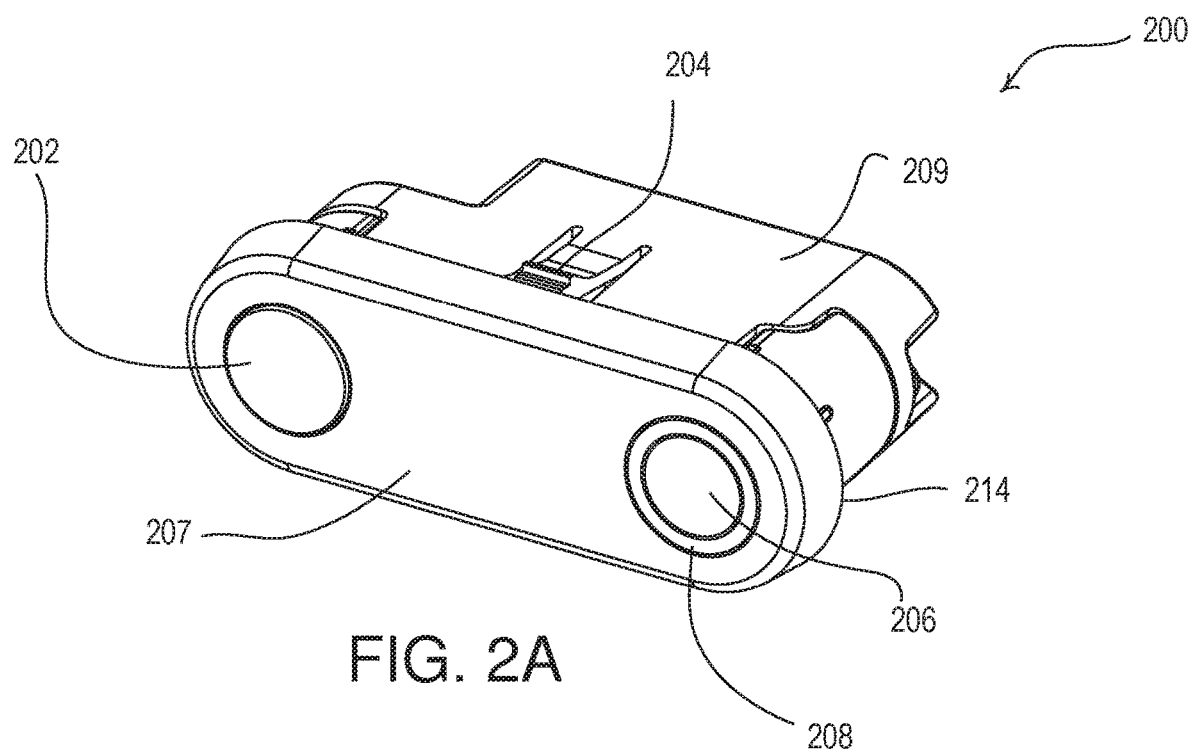
FIGS. 2A and 2B are perspective views depicting an example control module for a lighting control device.
Figure 2B:
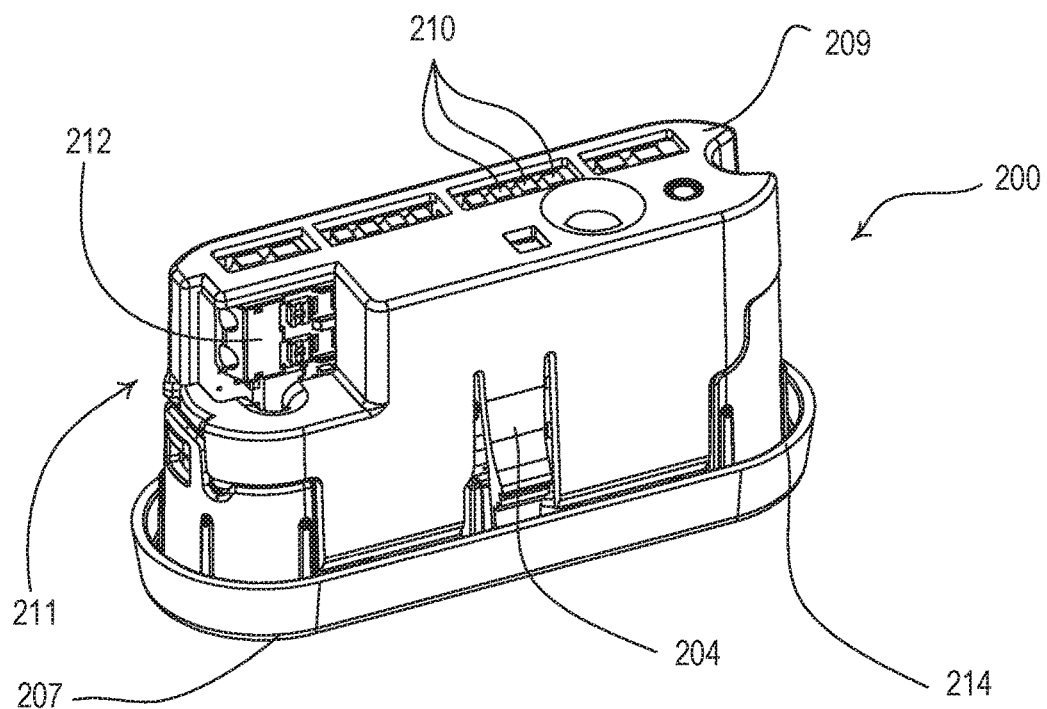

FIGS. 2A and 2B are perspective views depicting an example control module 200 for a lighting control device, which may be deployed as the control modules 120a, 120b, 120c, 120d shown in FIG. 1. The control module 200 may be configured to attach to a lighting fixture and electrically connect to different types of lighting control devices, such as different types of LED drivers, for example. The control module 200 may be electrically connected to the lighting control device (e.g., via a wired communication link and/or control link) to enable control of the lighting control device in response to information provided from the control module 200. The control module 200 may comprise a control circuit for controlling the operation of the control module.

The control module 200 may be mounted to a lighting fixture. For example, the control module 200 may include a clip 204 configured for attachment to a lighting fixture. The clip 204 may be located on a side portion of the control module 200. The clip 204 may be received by the lighting fixture for locking the control module 200 into a receiving portion (e.g., an opening) of the lighting fixture.

The control module 200 may be configured with an occupancy sensor lens 202. The occupancy sensor lens 202 may be made of at least a partially infrared or visible light transparent material to allow an occupancy sensing circuit 402 (FIG. 4) installed behind the occupancy sensing lens 202 to detect motion (e.g., occupancy and/or vacancy conditions) in the visible area of a load control environment. For example, the occupancy sensing circuit 402 may be a passive infrared (PIR) sensor capable of sensing infrared energy in the load control environment or a camera capable of identifying motion in the load control environment. The occupancy sensor lens 202 may be located on a front cover portion 207 located on a front side of the control module 200 to allow the occupancy sensing circuit 402 to detect occupancy/vacancy conditions in the load control environment beneath the lighting fixture to which the control module 200 may be attached.

The control module 200 may be configured with a light pipe 208, which may be made of a light-transmissive material, such as clear plastic. The light pipe 208 may be configured to receive light (e.g., daylight) from a load control environment and conduct the light to a light sensing circuit, e.g., a daylight sensing circuit 604 (FIG. 6A), such as a photosensor or a photodiode, located inside the control module 200. The light pipe 208 may have a front surface 208c (e.g., a lens portion) located on the front cover portion 207 of the control module 200 for allowing light to enter the control module 200. The light pipe 208 may also comprise a first conductive portion 208a for conducting the light to the daylight sensing circuit 604 to allow for the daylight sensing circuit to measure an amount of daylight in the load control environment beneath the lighting fixture to which the control module 200 may be attached.

The light pipe 208 may comprise a second conductive portion 208b configured to transmit light from a feedback LED 602 (FIG. 6A) located inside of the control module 200 to the front surface 208c to provide feedback to a user. For example, the light pipe 208 may provide feedback (e.g., by flashing the feedback LED 602 in one or more colors) to communicate information during configuration of the control module 200 (e.g., to indicate when the control module is in an association mode or a discovery mode) and/or during normal operation to indicate a status of the control module and/or the load being controlled by the control module 200 (e.g., a fault condition, such as a failed lamp). The front surface 208c of the light pipe 208 may be located on the front cover portion 207 of the control module 200 to allow for an occupant of the load control environment to see the feedback.

The control module 200 may include a configuration button 206. Actuation of the configuration button 206 may enable programming of the control module and/or the lighting control device to which the control module is connected. For example, the actuation of the configuration button 206 may put the control module 200, and/or the lighting control device to which the control module 200 is connected, in an association mode or a discovery mode. In the association mode, the control module 200 and/or the lighting control device may transmit and/or receive association messages for being associated with other devices. In the discovery mode, the control module 200 and/or the lighting control device may transmit and/or respond to discovery messages for being discovered with other devices. In addition, the control module 200 may be configured to change a communication frequency at which RF signals (e.g., the RF signals 172) are transmitted and/or received in response to actuations of the configuration button 206. Further, the control module 200 may be configured to restore the control module 200 to an initial setting (e.g., to factory defaults) in response to actuations of the configuration button 206.

The configuration button 206 may be located on the front cover portion 207 of the control module 200 to allow for access by an occupant of the load control environment. The configuration button 206 may be surrounded by the light pipe 208. For example, the configuration button 206 may be surrounded by the light pipe 208 to conserve space on the front cover portion 207 of the control module 200.

As shown in FIG. 2B, the control module 200 may include programming contacts 210. The programming contacts 210 may be used to program a memory of the control circuit with programming information during manufacturing of the control module and/or in the field. For example, the control module 200 may use the programming information stored in the memory to determine the digital messages to send to the lighting control device to which the control module 200 is connected. In addition, the programming information may include the lighting levels to which to control the LED load controlled by the lighting control device in response to input signals received by the control module 200. The input signals may be occupancy/vacancy conditions sensed by the control module 200, daylight levels sensed by the control module 200, RF signals received by the control module 200, and/or other input signals received by the control module 200. The programming contacts 210 may also, or alternatively, test the programmed functions of the control module 200 (e.g., as part of an end-of-line test during manufacturing of the control module 200).

The programming contacts 210 may be received through a rear cover portion 209 located on a rear side of the control module 200. The programming contacts 210 may be visible through the rear cover portion 209 of the control module to enable programming of the control module prior to installation. After the control module 200 is installed in the lighting fixture, the programming contacts 210 may be hidden or inaccessible (e.g., covered by a label) to prevent the programming from being modified without disconnecting the control module 200 from the lighting fixture.

The control module 200 may include a communication link connector 212. The communication link connector 212 may be configured to receive a connection for a wired communication link and/or control link (e.g., a Digital Addressable Lighting Interface (DALI) communication link, a LUTRON® ECOSYSTEM® communication link, or another wired digital communication link) that may be connected to the LED driver of the lighting fixture. The communication link connector 212 may be located in a receded side portion 211 of the control module 200. The receded side portion 211 may enable the connection for the communication link to be connected to the control module 200 without extending beyond the rear cover portion 209 of the control module 200. Alternatively to including a communication link connector 212, the control module 200 may include one or more wires. For example, the control module 200 may include wires that are soldered or otherwise electrically attached to the control module and which may insert through the back cover portion 209 when the control module 200 is installed in a fixture. The wires and/or the communication link connector 212 may be connected to a differential filter to remove or reduce noise coupling into the circuit of 404A. For example, the wires and/or the communication link connector 212 may be connected to a low-pass filter to remove common-mode noise.

The front cover portion 207 of the control module 200 may include a lip 214. The lip 214 may be configured to rest against the edge of the fixture, such that the front cover portion 207 extends below the fixture. The clip 204 may be located at a position on a side portion of the control module 200 that connects to the receiving portion of the lighting fixture such that the lip 214 rests against the edge of the fixture.

FIGS. 3A-3F are orthographic views depicting different sides of the example control module 200 shown in FIGS. 2A and 2B. As shown in FIG. 3A, a first side of the front cover portion 207 may include the occupancy sensor lens 202 and a second side of the front cover portion 207 may include the light pipe 208. The configuration button 206 may be on the same side as the light pipe 208 (e.g., surrounded by the light pipe). FIG. 3A also illustrates the position at which the cross-section 302 was taken for the cross-section view shown in FIG. 4.

As shown in FIGS. 3B-3E, the occupancy sensor lens 202 may extend convexly from the front cover portion 207 to increase visibility to the occupancy sensor within the load control environment. For example, a passive infrared (PIR) occupancy sensor may use a Fresnel lens. In another example, a camera occupancy sensor may use a fisheye lens. A first side of the control module 200, shown in FIG. 3B, may include the clip 204 configured for attachment to a lighting fixture. The same side of the control module 200 may include the communication link connector 212.

As shown in FIG. 3F, the rear cover portion 209 may also be affixed to the front cover portion 207 with a screw 318. The screw 318 may be received through the rear cover portion 209 and may be received on a rear side of the front cover portion 207.

Figure 4:
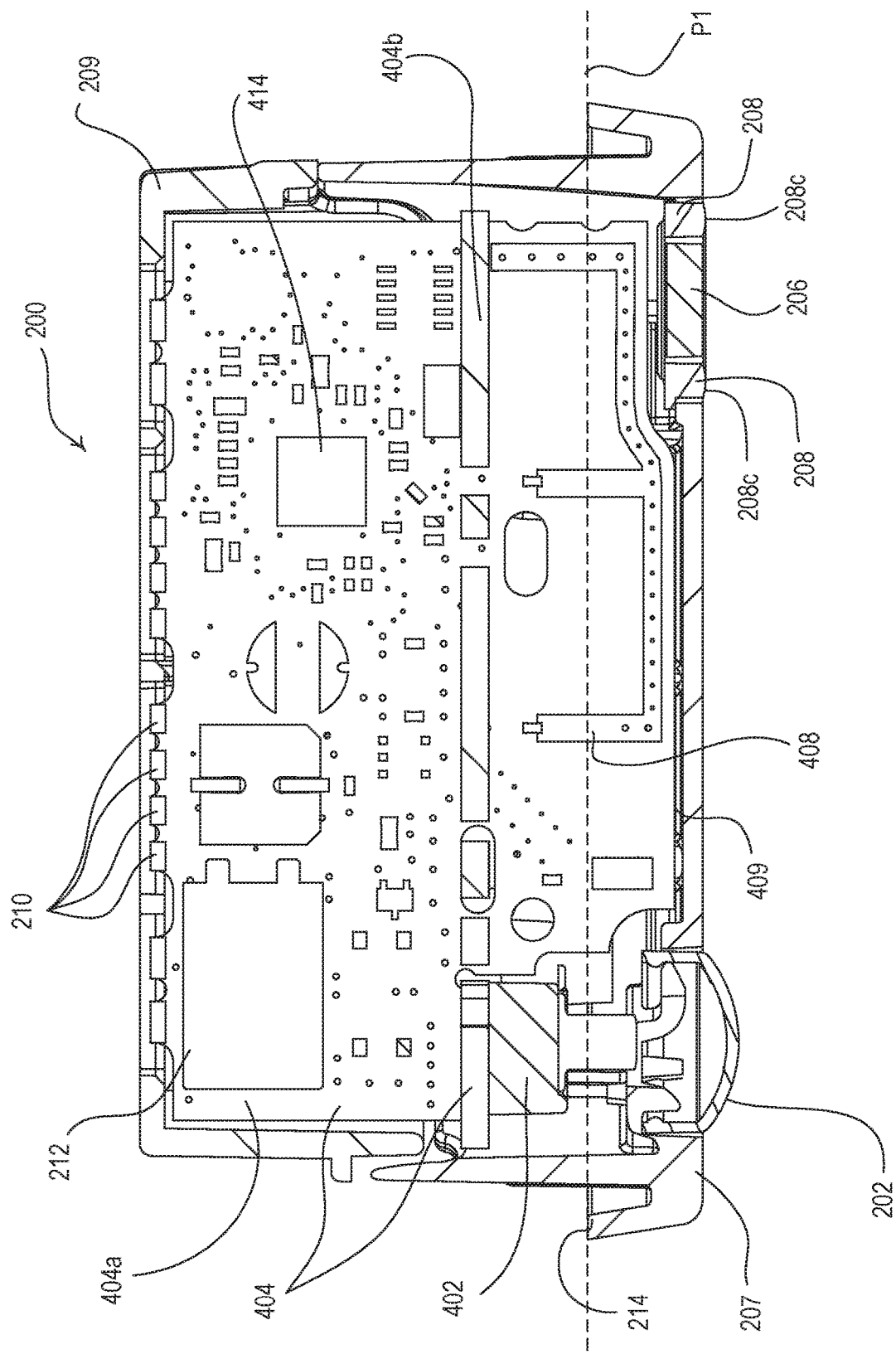
FIG. 4 is an enlarged side cross-section view of the example control module shown in FIGS. 2A and 2B.

FIG. 4 is an enlarged side cross-section view of the example control module 200 shown in FIGS. 2A and 2B. As shown in FIG. 4, the control module 200 may include a printed circuit board (PCB) assembly 404. The PCB assembly 404 may include a main PCB 404a and/or a sensor PCB 404b. The main PCB 404a may be encased in the front cover portion 207 and the rear cover portion 209. The main PCB 404a may be mounted vertically extending from the front cover portion 207 of the control module 200 to the rear cover portion 209 of the control module 200. One or more sensors of the control module 200 may be mounted to the sensor PCB 404b. The sensor PCB 404b may be configured to be installed at a right angle perpendicular to the main PCB 404a. The sensor PCB 404b may be installed perpendicular to the main PCB 404a to allow the sensors connected thereto to face the front side of the control module 200.

The main PCB 404a may include main processing portions and/or input/output connectors for the control module. For example, the main PCB 404a may include a processor 412 (FIG. 6C) of the control circuit, an RF transceiver integrated circuit 414, and/or the communication link connector 212. The control circuit may perform the primary control functions for the control module 200.

The control circuit may generate digital messages for controlling the lighting control device (e.g., LED driver) to which the control module 200 is connected (e.g., via the communication link connector 212) in response to sensor information received from the sensors connected thereto. The sensor PCB 404b may include the occupancy sensing circuit 402 and/or the daylight sensing circuit 604. The occupancy sensing circuit 402 may be a passive infrared (PIR) sensor capable of identifying a change in infrared energy received through the occupancy sensor lens 202 on the front cover portion 207 of the control module 200. The daylight sensing circuit 604 may be a photosensor, a photodiode, camera, or other circuit for sensing daylight levels. The daylight sensing circuit 604 may be located on the sensor PCB 404b adjacent to the first conductive portion 208a of the light pipe 604 and facing the front portion 207 of the control module 200. The feedback LED 602 may be located on the sensor PCB 404b adjacent to the second conductive portion 208b of the light pipe 604 and facing the front portion 207 of the control module 200.

The main PCB 404a may include a wireless communication circuit capable of communicating wirelessly via an antenna 408. The antenna 408 may be a standard loop antenna capable of transmitting and/or receiving radio frequency (RF) communication signals (e.g., near field communication (NFC) signals; BLUETOOTH® signals; WI-FI® signals; ZIGBEE® signals, a proprietary communication signals, such as CLEAR CONNECT™, etc.). The loop antenna 408 may have a first end that is grounded and a second end that is connected to the wireless communication circuit on the main PCB 404a.

The loop antenna 408 may be located on the main PCB 404a, such that the loop antenna 408 is located substantially toward the front cover portion 207 of the control module 200 and adjacent to a bottom edge 409 of the main PCB 404a. The loop antenna 408 may be located on the main PCB 404a, such that at least a portion (e.g., the majority) of the transmit/receive portions of the loop antenna 408 are located below a bottom plane P1 tangential to the lip 214, which abuts a bottom of the metal lighting fixture after attachment. The control module 200 may be attached to the lighting fixture such that the lip 214 rests against the bottom edge of the metal fixture. The location of the transmit/receive portions of the loop antenna 408 may allow for greater transmission/reception of RF signals, as at least a portion of the transmit/receive portions of the loop antenna 408 may be located within the plastic lip 214 of the front cover portion 207 of the control module 200. The transmit/receive portions of the loop antenna 408 may also comprise an edge-plated conductive trace (not shown) on the bottom edge 409 of the main PCB 404a.

Figure 5:
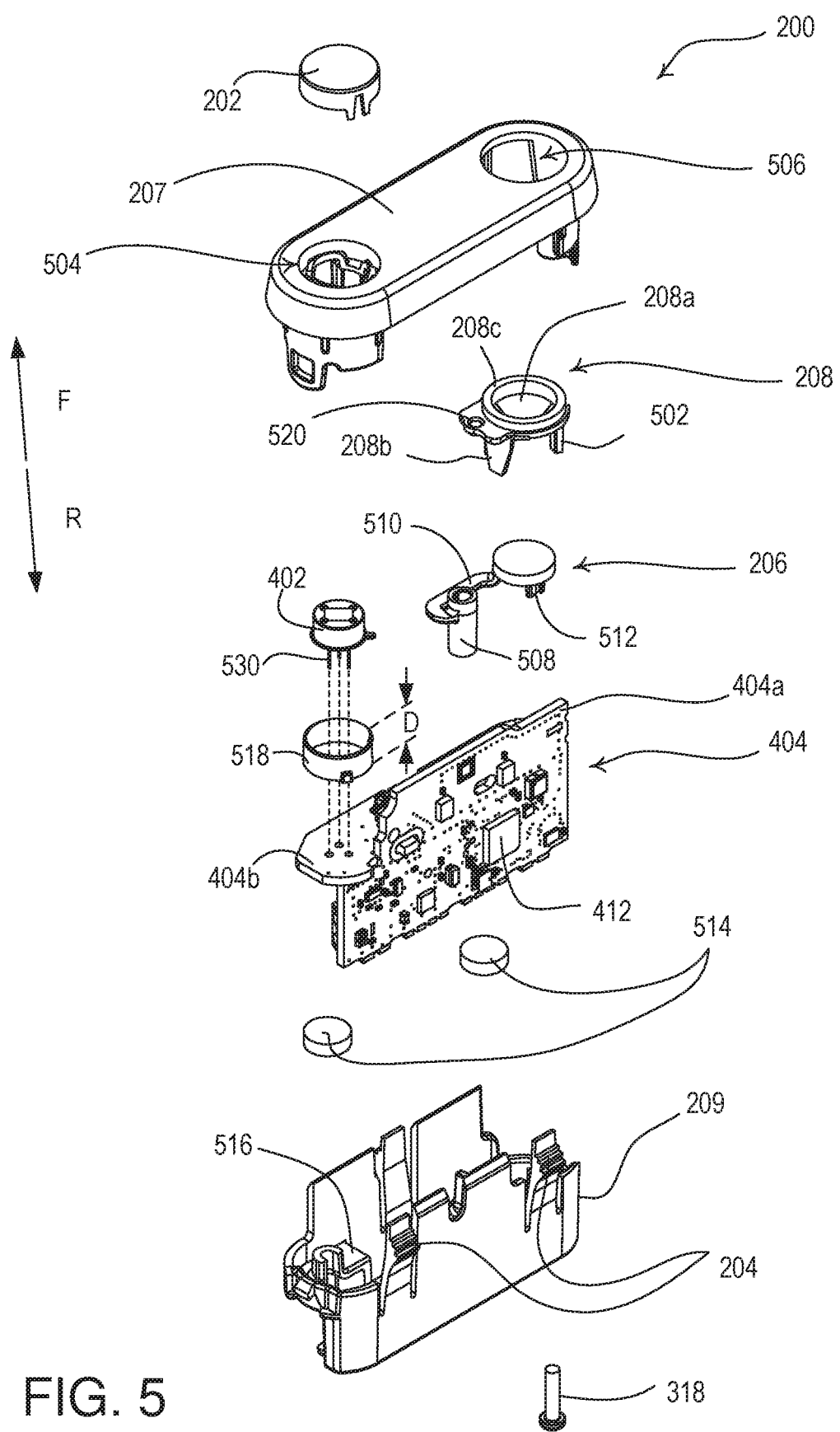
FIG. 5 is a partially exploded view of the example control module shown in FIGS. 2A and 2B.

FIG. 5 is a partially exploded view of the example control module 200 shown in FIGS. 2A and 2B. As shown in FIG. 5, the front cover portion 207 of the control module 200 may receive the occupancy sensor lens 202 from the direction R in a first opening 504. The front cover portion 207 of the control module 200 may receive the occupancy sensing circuit 402 in the first opening 504 from the direction F. The front cover portion 207 of the control module 200 may receive the light pipe 208 in a second opening 506 from the direction F. The front cover portion 207 may be pointed down into the load control environment when the control module 200 is mounted to the lighting fixture (e.g., the direction F may be pointed downwards).

The occupancy sensing circuit 402 may have one or more leads 530. The leads 530 may be configured to insert into the sensor PCB 404b. The leads 530 may electrically connect the occupancy sensing circuit 402 to the sensor PCB 404b. The leads may further be surrounded by a conductive shield 518. The conductive shield 518 may prevent radio frequency interference from coupling into the occupancy sensing circuit 402 via the leads 530. The occupancy sensing circuit 402 may be spaced apart from the sensor PCB 404b by a distance D1. The distance D1, for example, may be approximately equal to the height of the conductive enclosure 518, such that the conductive enclosure 518 fully surrounds the leads 530.

The light pipe 208 may include the light pipe portion 208a for the daylight sensing circuit (e.g., photodetector) and/or the light pipe portion 208b for the feedback LED. The light pipe 208 may be supported on the PCB assembly 404 by a support leg 502. For example, the support leg 502 may be attached to the light pipe 208 and rest on a portion of the sensor PCB 404b facing the direction F.

The configuration button 206 may be received in a central opening of the light pipe 208 from the direction F. The configuration button 206 may be supported on the PCB assembly 404 by a support post 508. For example, the support post 508 may be attached to the configuration button 206 and rest on a portion of the sensor PCB 404b facing the direction F. The support post 508 may be affixed to the configuration button 206 by a spring arm 510. The spring arm 510 may be made of a flexible material (e.g., plastic, metal, etc.) that allows the configuration button 206 to be actuated (e.g., pressed) while resting in the opening 506. The actuation of the configuration button 206 may cause an actuation post 512 extending from the rear side of the configuration button 206 in the direction R to actuate a mechanical tactile switch located on the sensor PCB 404b. The actuation of the configuration button 206 may cause the control module 200 and/or the lighting control device to which the control module is connected to enter an association mode or a discovery mode.

Alternatively, the control module 200 may not comprise a light pipe 208 for conducting light to the daylight sensing circuit 604. For example, the control module 200 may comprise a light-transmissive lens (e.g., just the front surface 208c of the light pipe 208) and may not include the first conductive portion 208a for conducting the light to the daylight sensing circuit 604. In addition, the control module 200 may not comprise the opening 506 for receiving the front surface 208c of the light pipe 208, and the light pipe 208 may be positioned behind the front cover portion 207 for conducting light that is transmitted through the front cover portion 207 to the daylight sensing circuit 604. Further, the control module 200 may simply comprise an opening in the front cover portion 207 for allowing light to shine on the daylight sensing circuit 604 without the use of the light pipe 208 or a lens.

Foam pads 514 may apply force to the rear side of the sensor PCB 404b. The foam pads 514 may rest on the rear cover portion 209 of the control module 200. For example, one of the foam pads 514 may rest on a ledge 516 that may be located behind the occupancy sensing circuit 402 on the sensor PCB 404b. The foam pads 514 may push the sensor PCB 404b forward in the direction F (e.g., toward the front cover portion 207 of the control module 200) to improve sensor performance. The foam pads 514 may push the daylight sensing circuit 604 closer to the first conductive portion 208a of the light pipe 208 to receive a greater amount of light (e.g., daylight) from the load control environment. The foam pads 514 may push the occupancy sensing circuit 402 closer to the occupancy sensor lens 202 to ensure that the occupancy sensing circuit 402 is able to detect motion in the load control environment. One or more of the foam pads 514 may be located on the reverse side of the sensor PCB 404b behind the occupancy sensing circuit 402. One or more of the foam pads 514 may be located on the reverse side of the sensor PCB 404b behind the daylight sensing circuit 604 and the light pipe 208.

Figure 6A:
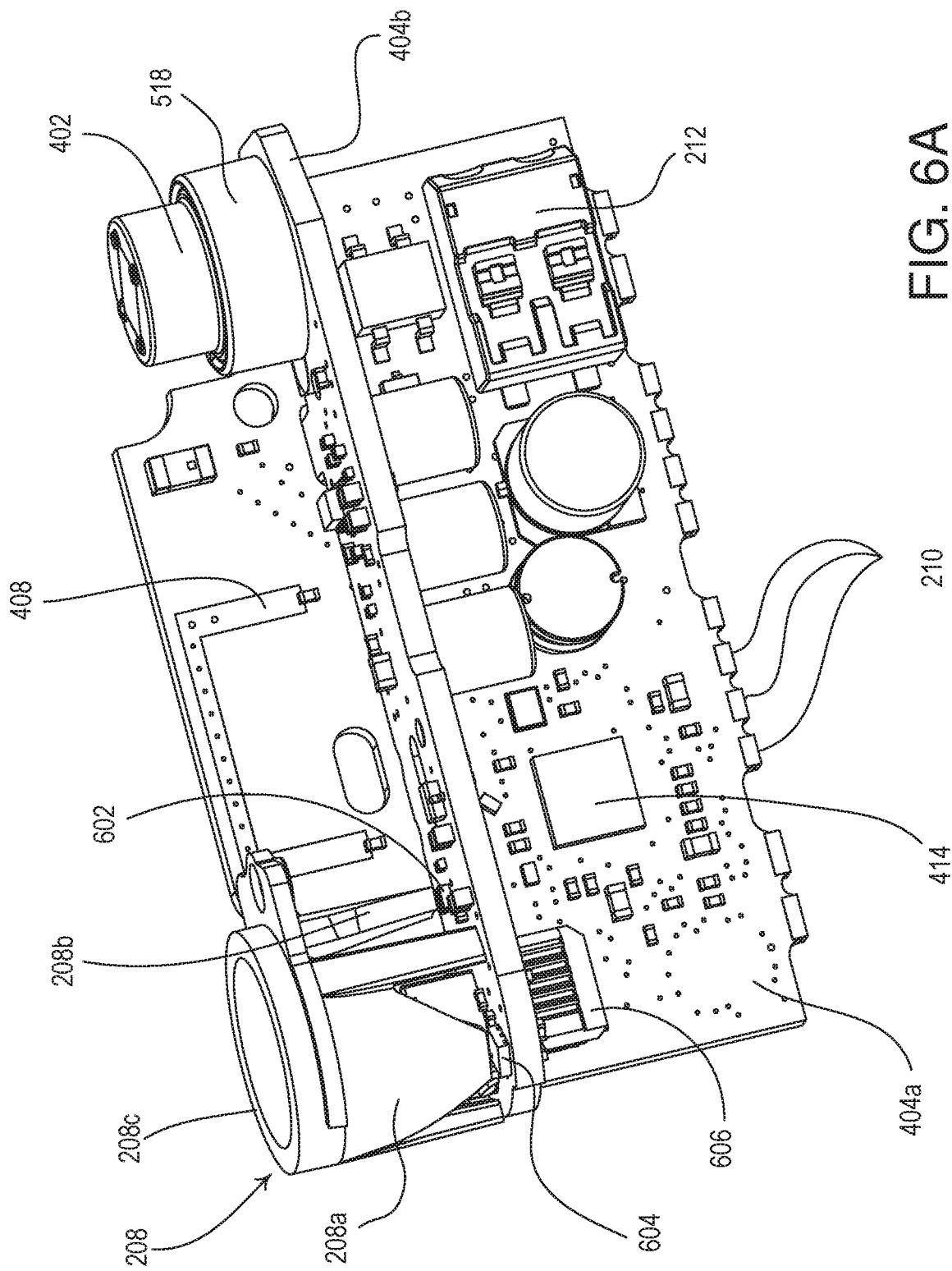
FIGS. 6A-6C are perspective views depicting the example control module shown in FIGS. 2A and 2B, without a front cover portion or a rear cover portion.
Figure 6B:
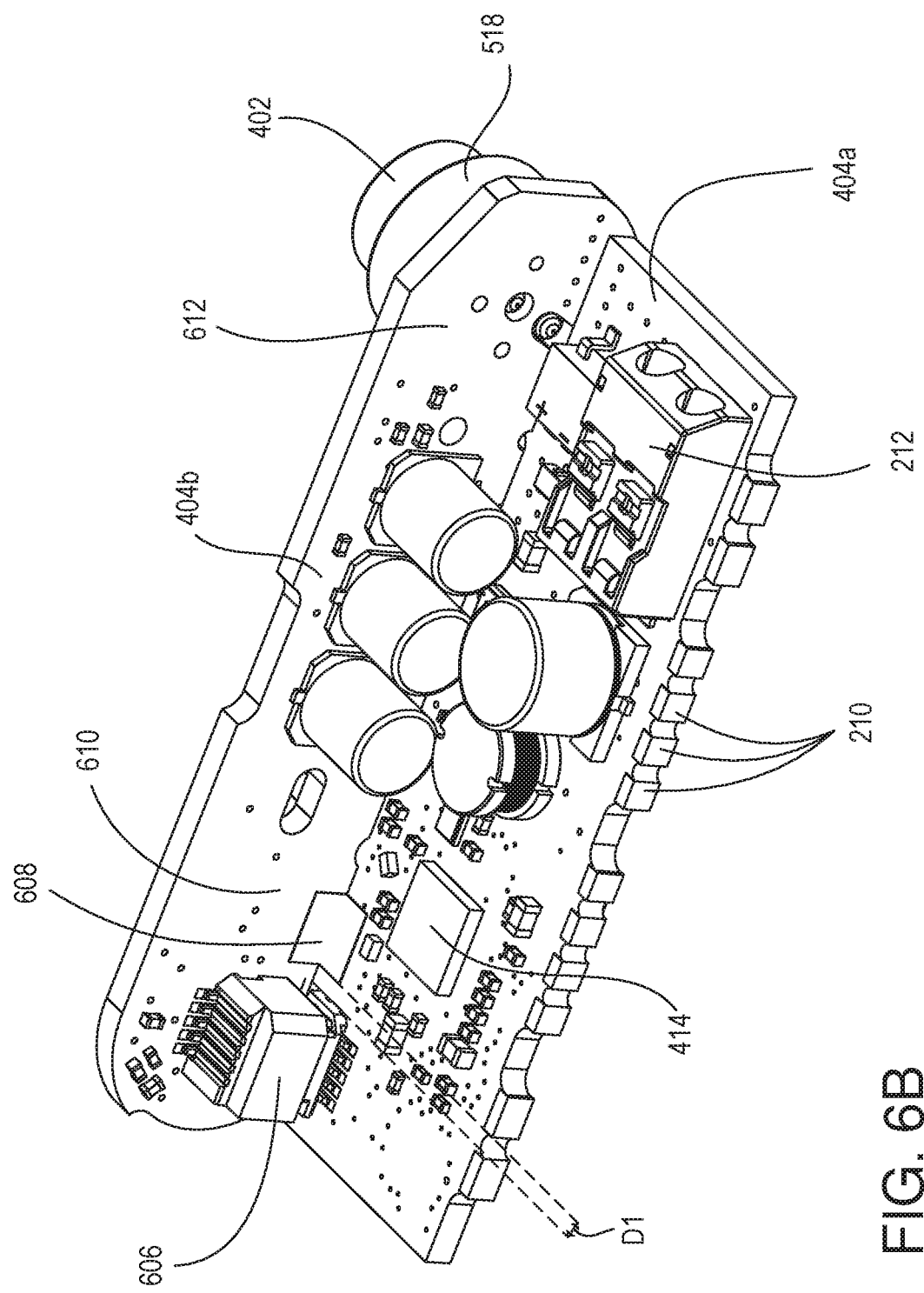
Figure 6C:
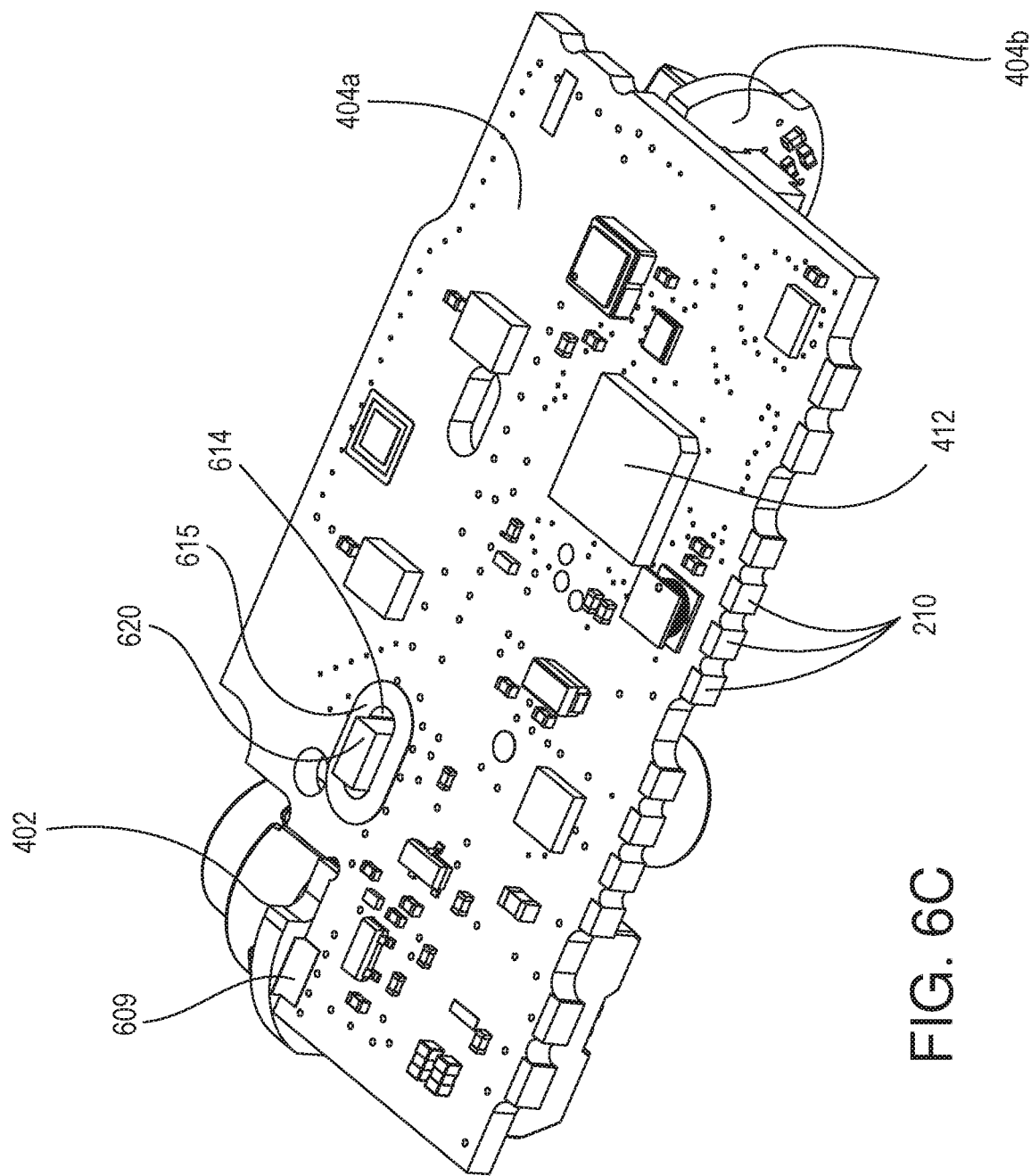

FIGS. 6A-6C are perspective views depicting the example control module 200, shown in FIGS. 2A and 2B, without the front cover portion 207 or the rear cover portion 209. As shown in FIG. 6A, the sensor PCB 404b may have attached thereto the occupancy sensing circuit 402 and the daylight sensing circuit 604 (e.g., a photodiode). The daylight sensing circuit 604 may be located proximate the light pipe portion 208a to receive daylight from the light pipe portion 208a. The feedback LED 602 may be located proximate the light pipe portion 208b to provide LED signals via the light pipe portion 208b.

The sensor PCB 404b may be affixed to the main PCB 404a in a perpendicular direction. The sensor PCB 404b may be electrically connected to the main PCB 404a via a surface mount plug/socket pair 606. The sensor PCB 404b may communicate sensor information to the main PCB 404a via the surface mount plug/socket pair 606.

The control circuit on the main PCB 404a may process the sensor information (e.g., from the occupancy sensing circuit 402 and/or the daylight sensing circuit 604) to generate control instructions for controlling a lighting control device electrically connected thereto. For example, the control circuit may generate control instructions that are communicated to the LED driver via the communication link connector 212, which may electrically connect the control module 200 to the LED driver or another lighting control device. The control instructions may be programmed via use of the programming contacts 210.

The control circuit may also, or alternatively, perform processing and/or communicate with the lighting control device in response to other information. For example, the main PCB 404a may have installed thereon the loop antenna 408, which may receive RF communications for programming the control module 200 and/or the lighting control device connected thereto. The digital messages may cause the control module 200 and/or the lighting control device connected thereto to enter an association mode and/or a discovery mode. The control circuit may receive control instructions via the loop antenna 408 for controlling the lighting control device connected thereto.

As shown in FIG. 6B, the main PCB 404a and the sensor PCB 404b may be affixed to one another with a first solder joint 608. The first solder joint 608 may lock the main PCB 404a and the sensor PCB 404b together. The first solder joint 608 may be located a distance D1 from the surface mount plug/socket pair 606 to support the electrical connection between the main PCB 404a and the sensor PCB 404b. The main PCB 404a and the sensor PCB 404b may also be affixed to one another with a second solder joint 609 as shown in FIG. 6C. In addition, the sensor PCB 404b may comprise a tab 620 that may be received by an opening 614 in the main PCB 404a and soldered to a pad 615 to further affix the main PCB 404a to the sensor PCB 404b.

The areas 610, 612 may be locations on the sensor PCB 404b at which the foam pads 515 shown in FIG. 5 may rest. The area 610 may be located behind the light pipe 208, the configuration button 206, and/or the support post 508. The area 612 may be located behind the occupancy sensing circuit 402 and/or the support leg 502.

The occupancy sensor circuit 402 may further include a conductive shield 518, which may be the same as conductive shield 518 shown in FIG. 5. The conductive shield 518 may surround one or more pins of the occupancy sensor circuit when the occupancy sensor circuit 402 is spaced at a height off of the sensor PCB 404b. The conductive shield 518 may be made of metal or any other suitable conductive material, such as conductive rubber, conductive plastic, etc. For example, the conductive shield 518 may surround the pins of the occupancy sensor circuit 402, without touching the pins. The conductive shield 518 may make electrical contact with a housing of the occupancy sensor circuit 402. The conductive shield 518 may prevent and/or reduce an amount of radio frequency interference (RFI) from coupling to, and interfering with, the occupancy sensor circuit 402.

As shown in FIGS. 6B and 6C, the programming contacts 210 may be edge-plated conductive pads on the side the main PCB 404a. The programming contacts 210 may be arranged on the side of the main PCB 404a to be received through the rear cover portion 209 located on the rear side of the control module 200.

Figure 6D:
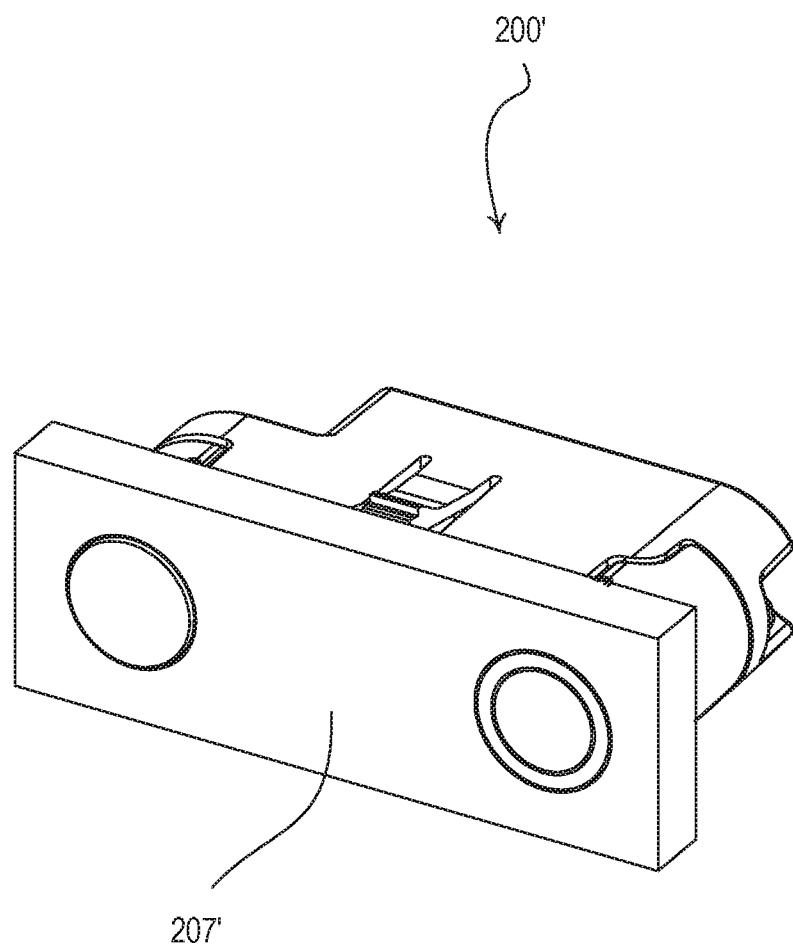
FIG. 6D is perspective view depicting another example control module for a lighting control device.

While the front cover portion 207 of the control module 200 shown and described herein has a "racetrack" shape with linear portions between circular side edges (e.g., as shown in FIG. 3A), the front cover portion 207 may also have a different shape. For example, the front cover portion 207 of the control module 200 may be a rectangular shape (e.g., as shown on a front cover portion 207' of a control module 200' in FIG. 6D), a square shape, a circular shape, an oval shape, or any suitable shape. In addition, the front cover portion 207 of the control module 200 may be planar or non-planar, and/or may be characterized by various colors, finishes, designs, patterns, etc. Further, the front surface 208c of the light pipe 208 and the configuration button 206 may each have a non-circular shape, such as, a rectangular shape, a square shape, an oval shape, or other suitable shape.

Figure 7A:
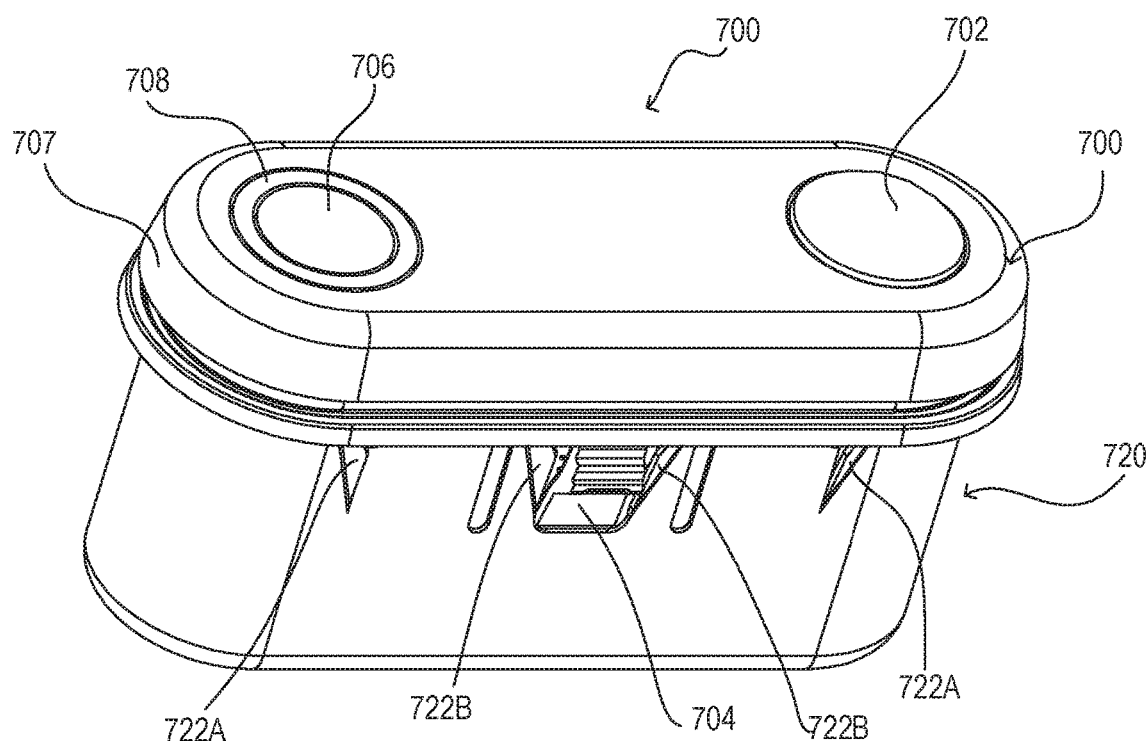
FIGS. 7A and 7B are perspective views of the depicting another example control module for a lighting control device, where the control module has a conductive enclosure.
Figure 7B:
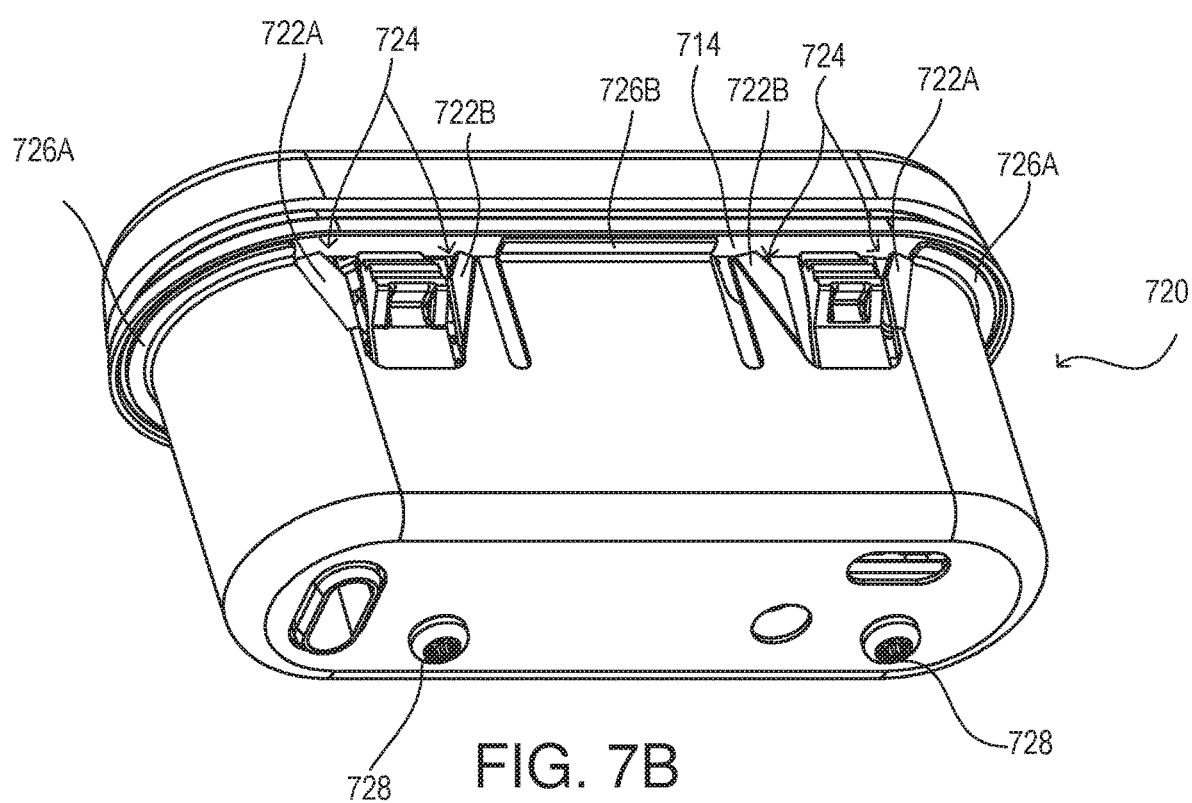

FIGS. 7A and 7B are perspective views of an example control module 700 installed inside a conductive enclosure 720. The control module 700 may be the same as, or similar to, control module 200 shown in FIG. 2. For example, the control module 700 may contain an occupancy sensor lens 702, a configuration button 706, a light pipe 708, one or more clips 704, and a front cover portion 707 having a lip 714, which may be similar to or the same as the corresponding elements 202, 206, 208, 204, 207, and 214, respectively, as previously described.

The control module 700 may be configured to be inserted into the conductive enclosure 720 before being installed into a lighting fixture (e.g., a metal lighting fixture). The conductive enclosure 720 may be made of metal, conductive plastic, or other conductive material. The conductive enclosure 720 may act as a shield (e.g., an electromagnetic or radio-frequency shield) to prevent or reduce an amount of radio-frequency interference (RFI) noise received by an antenna of the control module 700. For example, the antenna may be located within the front cover portion 707 of the control module 700 (e.g., as in the control module 100). The conductive enclosure 720 may make electrical contact with the metal lighting fixture to prevent RFI from coupling into the antenna of the control module 700. For example, the conductive enclosure 720 may prevent RFI noise generated inside the metal lighting fixture (e.g., from the lighting control device) from coupling into the antenna of the control module 700.

The control module 700 may be inserted into the conductive enclosure 720 and may be secured to the conductive enclosure 720 by one or more mechanical attachment mechanisms. For example, the conductive enclosure 720 may be attached to the control module 700 via one or more screws 728. Alternatively, the conductive enclosure 720 may be attached to the control module 700 via any of the following methods: snaps, heat stakes, rivets, adhesive materials, magnets, and the like. The conductive enclosure 720 and control module 700 assembly may then be installed in a lighting fixture. For example, the conductive enclosure 720 and the control module 700 may be snapped into the lighting fixture. Alternatively, the conductive enclosure 720 may first be installed in the lighting fixture, and the control module 700 may then be assembled or attached to the conductive enclosure 720 in the lighting fixture, using any of the mechanical adherence mechanisms previously described.

Figure 8A:
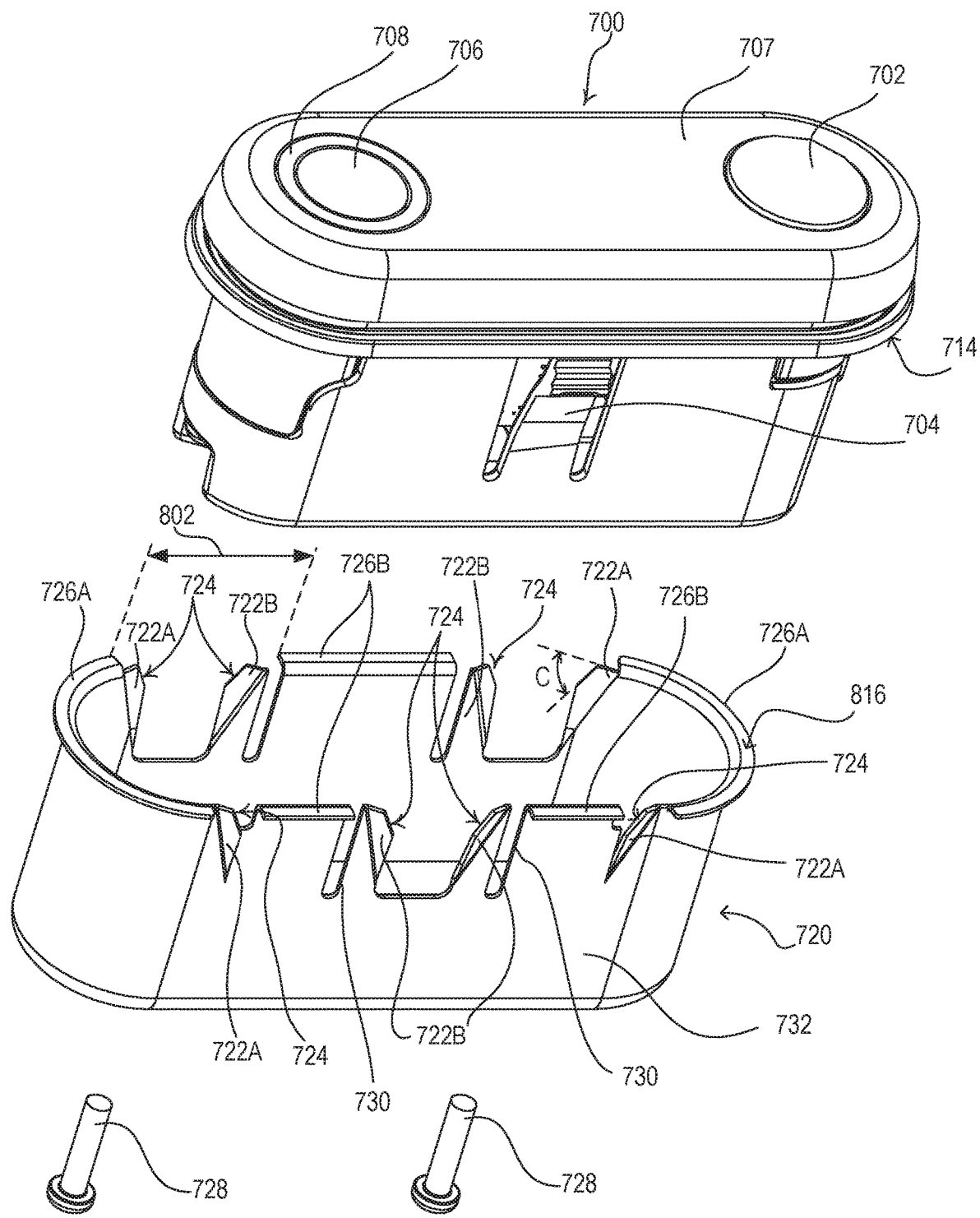
FIGS. 8A and 8B are partially exploded view of the example control device and conductive enclosure shown in FIGS. 7A and 7B.
Figure 8B:
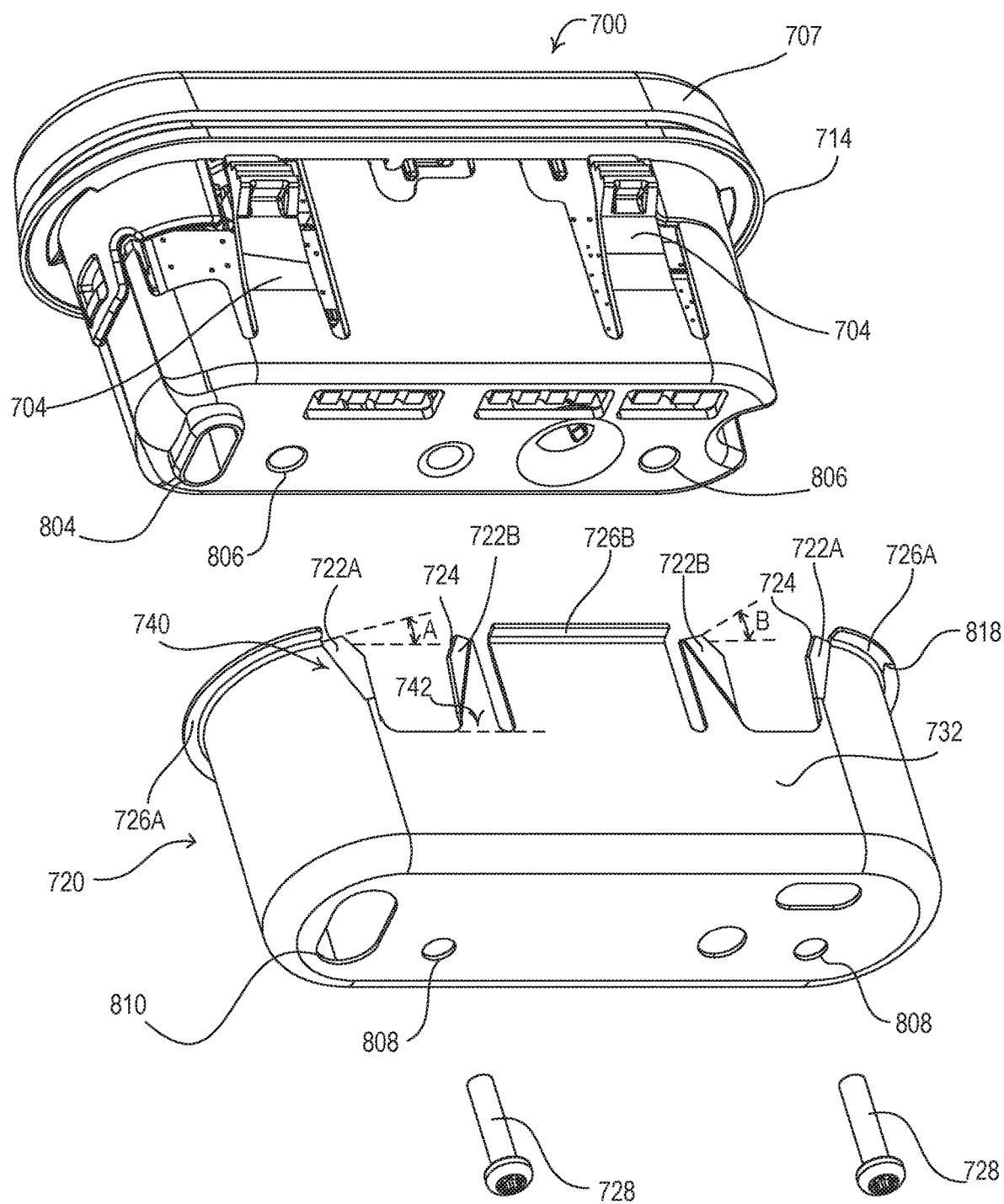

FIGS. 8A and 8B are partially exploded view of the example control module 700 and the conductive enclosure 720 shown in FIGS. 7A and 7B. FIGS. 8A and 8B show the control module 700 depicted with the conductive enclosure 720 removed and the screws 728 uninstalled. The conductive enclosure 720 may include one or more apertures 808. Similarly, the control module 700 may contain one or more apertures 806. The screws 728 may insert through one or more apertures 808 in the conductive enclosure 720 to one or more apertures 806 in the control module 700 to fasten the conductive enclosure 720 to the control module 700, as shown in FIG. 8B.

The control module 700 may further comprise an aperture 804 located on the back cover portion of the control module, through which one or more wires may extend, as previously described. The wires may further extend through the corresponding aperture 810 on the conductive enclosure 720 when the conductive enclosure 720 is attached to the control module 700.

FIGS. 9A-9D are orthographic views depicting different sides of the conductive enclosure 720 shown in FIGS. 7A and 7B. FIG. 9A is a bottom view of the conductive enclosure 720. FIG. 9B is a front side view of the conductive enclosure 720. FIGS. 9C and 9D are left-side and right-side views of the conductive enclosure 720, respectively.

The conductive enclosure 720 may comprise one or more flanges 726A, 726B that are configured to abut the lip 714 of the control module 700 when the conductive enclosure 720 is installed on the control module 700. FIG. 8A shows a first side 816 of the flanges 726A, 726B and FIG. 8B shows a second side 818 of the flanges 726A, 726B. The flanges 726A, 726B may also be configured to abut the metal lighting fixture when the control module 700 and the conductive enclosure 720 are installed in the metal lighting fixture.

The flanges 726A, 726B may be configured to abut the lip 714 of the front cover portion 707 on the first side 816, as shown in FIG. 8A. The flanges 726A, 726B may be configured to abut a metal lighting fixture on the second side 818, as shown in FIG. 8B, when the conductive enclosure 720 and the control module 700 are installed in the metal lighting fixture. For example, the flanges 726A may be continuous around the curved end portions of the perimeter of the conductive enclosure 720. The flanges 726B may cover one or more straight portions of the perimeter of the conductive enclosure 720. For example, the flanges 726A and 726B may be be separated by one or more gaps to allow room for the clips 704 of the control module 700. For example, the flange 726A may be separated from the flange 726B by the gap 802 as shown in FIG. 8A.

The RFI noise may couple into the antenna of the control module 700 through the one or more gaps between the metal lighting fixture and the conductive enclosure 720. The flanges 726A, 726B may operate to maximize the surface area of the conductive enclosure 720 that contacts the metal lighting fixture, or reduce the amount of length along a perimeter of the conductive enclosure 720 that does not contact the metal lighting fixture. That is, the flanges 726A, 726B may reduce a length of one or more gaps, such as gap 802, which may reduce an amount of RFI noise coupled into the antenna of the control module 700. The length of the one or more gaps 802 may be designed according to the frequency of interest of the RFI. The frequency of interest may be, for example, the radio-frequency of the antenna of the control module 700. For example, a higher frequency of interest RFI noise, such as a frequency of 2.4 GHz, may be more effectively reduced using a shorter gap length compared to a gap length required to reduce a lower frequency of interest RFI noise, such as a sub-GHz frequency.

The conductive enclosure 720 may further contain one or more springs 722A, 722B. For example, the springs 722A, 722B may be teeth, fins or other portions of the conductive enclosure. The springs 722A may be located adjacent to respective ends of the outer curved flanges 726A, while the springs 722B may be located adjacent to respective relief cutouts 730 next to the straight flanges 726B. The springs 722A, 722B of the conductive enclosure 720 may be be located on either side of the clips 704 of the control module 700. The conductive enclosure may comprise additional springs along the perimeter of the enclosure.

The springs 722A, 722B may be angled outwardly from sides 732 of the conductive enclosure 720. For example, the springs 722A may bend outward from the sides 732 of the conductive enclosure 720 by an angle A as shown in FIG. 8B. The springs 722B may bend outward from the sides 732 of the conductive enclosure 720 by an angle B as shown in FIG. 8B. The angle A may be less than the angle B. For example, the angle A may be approximately 28 degrees, while the angle B may be 45 degrees. When the conductive enclosure is installed in the metal lighting fixture, the springs 722A, 722B may be configured to bend (e.g., compress) towards the side of the conductive enclosure and to provide a spring force to hold the conductive enclosure 720 against the metal fixture. The springs 722A, 722B may be configured to hold the conductive enclosure 720 (and thereby the control module 700) against the metal lighting fixture when the conductive enclosure 720 is installed in the metal fixture.

The springs 722A, 722B may each have the same (or similar) geometries. Alternatively, the springs 722A may have a slightly different geometry than springs 722B. For example, the springs 722A may have a geometry that allows the springs 722A to be stiffer than the springs 722B. For example, each spring 722A may be located adjacent to the flange 726A and may bend around an axis 740. Each spring 722B may be located adjacent to one of the relief cutouts 730 and may bend around an axis 742. The springs 722B may bend more easily around the axes 742 than the springs 722A bend around the axes 740. The relief cutouts 730 may allow the respective springs 722B to bend around the axes 742 when the springs 722B are compressed by the metal lighting fixture, without deformation of the flanges 726B. The springs 722A may be stiffer (e.g., may have a higher spring constant) than the springs 722B, due to the differences in the axes 740, 742 of the springs 722A, 722B.

One will understand that the angles A, B and the number of springs shown and described in the embodiments herein are for illustrative purposes only, and that the invention is not limited to the number of springs shown nor the specific angles described. Further, adding additional springs to the conductive enclosure 720 may improve the adherence of the conductive enclosure to the metal lighting fixture and may further reduce an amount of RFI coupled into the antenna of the control module 700. However, additional springs may also increase an amount of force required to install the conductive enclosure in the metal fixture and may further increase the number of gaps between the conductive enclosure 720 and the metal fixture, which may allow additional RFI noise to be coupled to the antenna of the control module 700.

Each of the springs 722A, 722B may contain a respective edge cut 724, for example, a chamfer cut. The edge cut 724 may be a reverse angle edge cut. Each of the edge cuts 724 of the springs 722A, 722B may act as teeth, that is, the edge cuts 724 may allow the conductive enclosure 720 to drive into the metal fixture during installation. The edge cuts 724, in combination with the springs 722A, 722B may act to hold the conductive enclosure 720 tight to the metal lighting fixture. Each edge cut 724 may be angled away from a top edge of the respective spring 722A, 722B by an angle C, as shown in FIG. 8A. For example, the angle C of each of the edge cuts 724 on the springs 722A, 722B may be approximately 60 degrees.

In some applications, the metal fixture may contain a non-conductive coating, such as paint or powder coating. The springs 722A, 722B with edge cut 724 may act to scrape away all or part of the non-conductive surface coating on the metal lighting fixture in a contact area between the edge cut 724 and the metal fixture. In this way, the edge cut 724 may improve the conductivity of the contact between the conductive enclosure and the metal lighting fixture. Although the edge cut 724 has been described as having an angle C of 60 degrees, one will understand that the angle C is not limited to 60 degrees, but may be any other angle that provides the same result. For example, the angle C of the reverse angle edge cut may be optimized based on a thickness of the sheet metal of the fixture.

Figure 10:
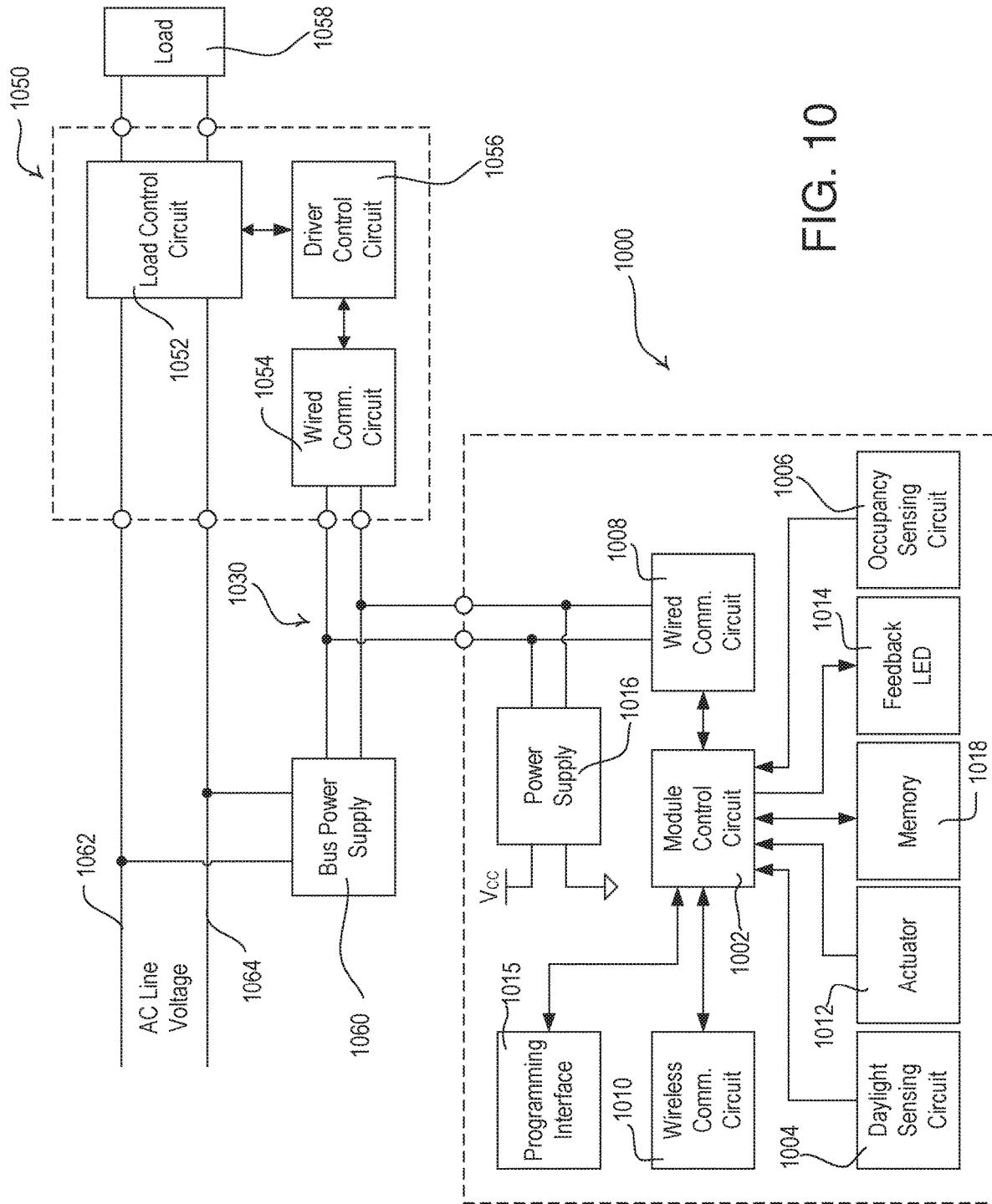
FIG. 10 is a block diagram of an example control module connected to a lighting control device.

FIG. 10 is a block diagram of an example control module 1000, which may be similar to the control module 200 described herein, connected to a lighting control device 1050. The control module 1000 may be connected to the lighting control device 1050 to perform sensing functions for controlling the lighting control device 1050 and/or to communication wireless signals with external devices. The lighting control device 1050 may be an LED driver for LED light sources, an electronic ballast for lamps, or other lighting control device. The control module 1000 may be configured to connect to different types of lighting control devices, such as different types of LED drivers, for example. The control module 1000 and the lighting control device 1050 may be mounted in the same fixture. For example, the control module 1000 may be configured to mount to a fixture in which the lighting control device 1050 may be installed.

The control module 1000 may be electrically connected to the lighting control device 1050 via a communication bus 1030. The communication bus 1030 may be a Digital Addressable Lighting Interface (DALI) communication link, a LUTRON® ECOSYSTEM® communication link, or another wired communication link. The communication bus 1030 may be connected to the control module 1000 and/or the lighting control device 1050 via a communication link connector, which may be similar to the communication link connector 212 described herein. The control module 1000 may send control signals via the communication bus 1030 to control the lighting control device 1050.

The control module 1000 may include a module control circuit 1002, which may be similar to the control circuit of the control module 200 described herein, for controlling the functionality of the control module 1000. The module control circuit 1002 may process information received as input and generate messages for being communicated via the communication bus 1030 to the lighting control device 1050. The module control circuit 1002 may include one or more general purpose processors, special purpose processors, conventional processors, digital signal processors (DSPs), microprocessors, integrated circuits, a programmable logic device (PLD), application specific integrated circuits (ASICs), or the like. The module control circuit 1002 may perform signal coding, data processing, power control, input/output processing, or any other functionality that enables the module control circuit 1002 to perform as described herein.

The module control circuit 1002 may store information in and/or retrieve information from the memory 1018. For example, the memory 1018 may maintain a registry of associated control devices. The memory 1018 may include a non-removable memory and/or a removable memory.

The control module 1000 may include a daylight sensing circuit 1004, which may be similar to the daylight sensing circuit 604 described herein. The daylight sensing circuit 1004 may be configured to measure a light intensity in the visible area of the daylight sensing circuit 1004. The daylight sensing circuit 1004 may transmit digital messages to the module control circuit 1002 that include the measured light intensity.

The control module 1000 may include an occupancy sensing circuit 1006, which may be similar to the occupancy sensing circuit 402 described herein. The occupancy sensing circuit 1006 may be configured to detect motion (e.g., occupancy and/or vacancy conditions) in the visible area of the occupancy sensing circuit 1006. Examples of the occupancy sensing circuit 1006 may include a passive infrared (IR) sensor capable of sensing infrared energy in the load control environment or a camera capable of identifying motion in the load control environment. The occupancy sensing circuit 1006 may transmit digital messages to the module control circuit 1002 that include the occupancy or vacancy conditions. The occupancy sensing circuit 1006 may operate as a vacancy sensing circuit, such that digital messages are transmitted in response to detecting a vacancy condition (e.g., digital messages may not be transmitted in response to detecting an occupancy condition).

The module control circuit 1002 may be in communication with one or more actuators, such as actuator 712 (e.g., configuration button 206). The actuator 712 may include one or more buttons for receiving input (e.g., an indication that a button has been actuated) at the control module 1000. The control module 1000 may receive inputs from the actuator 712 to put the module control circuit 1002 in an association mode or a discovery mode as described herein. The control module 1000 may also comprise a programming interface 1015, which may be similar to the programming contacts 210 described herein. For example, the module control circuit 1002 may receive inputs from the programming interface 1015 to program and/or test the control module 1000. For example, the module control circuit 1002 may receive inputs from the programming interface 1015 to program the memory 1018 with programming information regarding the digital messages to be sent to the lighting control device in response to inputs received from the daylight sensing circuit 1004, the actuator 712, the occupancy sensing circuit 1006, and/or the wireless communication circuit 1010.

The control module 1000 may include a wireless communications circuit 1010, which may operate via the loop antenna 408 described herein, for transmitting and/or receiving information. The wireless communications circuit 1010 may transmit and/or receive information via a wireless communications channel (e.g., near field communication (NFC); BLUETOOTH®; WI-FI®; ZIGBEE®, a proprietary communication channel, such as CLEAR CONNECT™, etc.). The wireless communications circuit 1010 may include a transmitter, an RF transceiver, or other circuit capable of performing wireless communications. The wireless communications circuit 1010 may be in communication with module control circuit 1002 for transmitting and/or receiving information.

The control module 1000 may include a wired communications circuit 1008. The wired communications circuit 1008 may transmit information to and/or receive information from the lighting control device 1050 via the communication bus 1030. The wired communications circuit 1008 may be in communication with module control circuit 1002 for transmitting and/or receiving information via the communication bus 1030.

The communication bus 1030 may be powered by a bus power supply 1060. The bus power supply 1060 may receive power via the hot connection 1062 and the neutral connection 1064 of an alternating current (AC) line voltage and may provide an amount of power to the communication bus 1030. The control module 1000 may comprise an internal power supply 1016 for generating a direct-current (DC) supply voltage $V_{CC}$ for powering the low-voltage circuitry of the control module 1000. The power supply 1016 may receive power from the bus power supply 1060.

The communication bus 1030 may be connected to a wired communication circuit 1054 of the lighting control device 1050. The connection of the communication bus 1030 to the wired communication circuit 1054 may enable the communication between the control module 1000 and the lighting control device 1050 to remain local (e.g., within a lighting fixture). The wired communications circuit 1054 may transmit information to and/or receive information from the control module 1000 via the communication bus 1030.

The wired communications circuit 1054 may be in communication with a driver control circuit 1056 for transmitting and/or receiving information via the communication bus 1030. The driver control circuit 1056 may include one or more general purpose processors, special purpose processors, conventional processors, digital signal processors (DSPs), microprocessors, integrated circuits, a programmable logic device (PLD), application specific integrated circuits (ASICs), or the like. The driver control circuit 1056 may perform signal coding, data processing, power control, input/output processing, or any other functionality that enables the lighting control device 1050 to perform as described herein.

The driver control circuit 1056 may generate control instructions for controlling the LED 1050. The driver control circuit 1056 may send the control instructions to a load control circuit 1052 for performing load control in response to the instructions. The load control circuit 1052 may receive instructions from the driver control circuit 1056 and may control the load 1058 (e.g., LED) based on the received instructions. The load control circuit 1052 may receive power via the hot connection 1062 and the neutral connection 1064 of an alternating current (AC) line voltage.

The load control circuit 1052 may send status feedback to the driver control circuit 1056 regarding the status of the load 1058. The status may be communicated to the control module 1000 and communicated to a user via a feedback LED 714. The feedback LED 714 may be controlled (e.g., flashed) by the module control circuit 1002.

Although features and elements are described herein in particular combinations, each feature or element can be used alone or in any combination with the other features and elements. The methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), removable disks, and optical media such as CD-ROM disks, and digital versatile disks (DVDs).

The invention claimed is:

1. A control module configured to be installed in a metal lighting fixture, the control module comprising:
    a front cover portion comprising a lip configured to rest against a bottom edge of the metal lighting fixture;
    a rear conductive enclosure configured to be in electrical contact with the metal lighting fixture when the control module is installed in the lighting fixture;
    a wireless communication circuit; and
    an antenna coupled to the wireless communication circuit for communicating radio frequency communication signals via the wireless communication circuit; and
    wherein the antenna and the wireless communication circuit are disposed between the front cover portion and the rear conductive enclosure.

2. The control module of claim 1, wherein the rear conductive enclosure is made of metal or conductive plastic, and the front cover portion is made of plastic.

3. The control module of claim 2, wherein the rear conductive enclosure at least partially shields the antenna from noise generated by the lighting control device.

4. The control module of claim 1, further comprising:
a first printed circuit board, the wireless communication circuit mounted to the first printed circuit board; and
wherein the antenna is located on the first printed circuit board.

5. The control module of claim 4, wherein the first printed circuit board extends from a front side of the control module to a rear side of the control module such that a majority of the antenna is contained within the lip.

6. The control module of claim 5, further comprising a rear cover configured to insert into the rear conductive enclosure.

7. The control module of claim 6, wherein the rear conductive enclosure comprises:
at least one flange, the flange having a first side configured to abut a surface of the metal lighting fixture.

8. The control module of claim 7, wherein the rear conductive enclosure further comprises at least two spring members comprising a reverse angle edge cut,
wherein the at least two spring members are configured to compress when the control module is installed in the metal lighting fixture.

9. The control module of claim 8, wherein the reverse angle edge cut is configured to dig into a surface of the metal lighting fixture to provide an electrical connection to the metal lighting fixture.

10. The control module of claim 8, wherein the reverse angle edge cut is configured to draw the control module closer to the metal lighting fixture such that the at least one flange abuts the surface of the metal lighting fixture.

11. The control module of claim 8, wherein the reverse angle edge cut is at an angle of 60 degrees from the surface of the metal lighting fixture.

12. The control module of claim 8, wherein the at least two spring members are bent away from the rear conductive enclosure at an angle of 45 degrees.

13. The control module of claim 5, wherein the antenna comprises a loop antenna.

14. The control module of claim 5, further comprising:
a second printed circuit board attached perpendicular to the first printed circuit board, the second printed circuit board having a sensing circuit mounted thereto, wherein the sensing circuit faces the front side of the control module.

15. The control module of claim 14, wherein the sensing circuit comprises an occupancy sensing circuit and a daylight sensing circuit.

16. The control module of claim 15, wherein the front cover portion comprises a lens that covers the occupancy sensing circuit.

17. The control module of claim 15, wherein the front cover portion comprises a light pipe portion that receives light for the daylight sensing circuit.

18. The control module of claim 14, wherein the sensing circuit comprises a passive infrared sensor having one or more leads, further wherein the passive infrared sensor is mounted a distance away from the second printed circuit board and is electrically connected to the sensor printed circuit board via the one or more leads such that the passive infrared sensor faces the front cover portion.

19. The control module of claim 18, wherein the control module further comprises a conductive shield around the one or more leads of the passive infrared sensor.

20. The control module of claim 1, wherein the front cover portion further comprises:
a light pipe portion that provides feedback from a light emitting diode; and
a button surrounded by the light pipe portion;
wherein actuation of the button enables programming of the control module.

* * * * *